(12) United States Patent
Edwards et al.

(10) Patent No.: US 7,449,070 B2
(45) Date of Patent: Nov. 11, 2008

(54) WAVEFORM GENERATOR FOR MICRODEPOSITION CONTROL SYSTEM

(75) Inventors: Charles O. Edwards, Pleasanton, CA (US); David Albertalli, San Jose, CA (US); James Middleton, Brentwood, CA (US); George Fellingham, San Jose, CA (US)

(73) Assignee: ULVAC, Inc., Kanagawa (JP)

( * ) Notice: Subject to any disclaimer, the term of this patent is extended or adjusted under 35 U.S.C. 154(b) by 630 days.

(21) Appl. No.: 10/479,323

(22) PCT Filed: May 31, 2002

(86) PCT No.: PCT/US02/17375

§ 371 (c)(1),
(2), (4) Date: Jun. 17, 2004

(87) PCT Pub. No.: WO02/098573

PCT Pub. Date: Dec. 12, 2002

(65) Prior Publication Data

US 2006/0251796 A1 Nov. 9, 2006

Related U.S. Application Data

(60) Provisional application No. 60/295,118, filed on Jun. 1, 2001, provisional application No. 60/295,100, filed on Jun. 1, 2001.

(51) Int. Cl.
*B05C 11/10* (2006.01)

(52) U.S. Cl. .................. 118/665; 118/669; 118/699; 427/427.2; 347/9; 347/10; 347/11; 347/12; 347/13

(58) Field of Classification Search .............. 118/665, 118/669, 699, 695; 427/427.2; 347/9–13
See application file for complete search history.

(56) References Cited

U.S. PATENT DOCUMENTS

| 4,395,716 | A | * | 7/1983 | Crean et al. .................. 347/76 |
| 5,498,444 | A | | 3/1996 | Hayes |
| 5,505,777 | A | | 4/1996 | Ciardella et al. |
| 5,681,757 | A | | 10/1997 | Hayes |
| 5,707,684 | A | | 1/1998 | Hayes et al. |
| 5,711,989 | A | | 1/1998 | Ciardella et al. |
| 5,914,732 | A | * | 6/1999 | Sakai et al. .................. 347/10 |

(Continued)

FOREIGN PATENT DOCUMENTS

WO WO00/43210 * 7/2000

*Primary Examiner*—George R Koch, III
(74) *Attorney, Agent, or Firm*—Harness, Dickey & Pierce, PLC

(57) ABSTRACT

A microdeposition system (20) and method includes a head with a plurality of nozzles (230). A controller (22) generates nozzle firing commands that selectively fire the nozzles to create a desired feature pattern. Configuration memory stores voltage waveform parameters that define a voltage waveform (280) for each of the nozzles. A digital to analog converter (DAC) sequencer communicates with the configuration memory and the controller and outputs a first voltage waveform for a first nozzle when a nozzle firing command for the first nozzle is received from the controller (22). A resistive ladder DAC receives the voltage waveforms from the DAC sequencer. An operational amplifier (opamp) communicates with the resistive ladder DAC and amplifies the voltage waveforms. The nozzles fire droplets when the voltage waveforms received from the opamp exceed a firing threshold of the nozzle (230).

20 Claims, 23 Drawing Sheets

U.S. PATENT DOCUMENTS

| | | |
|---|---|---|
| 5,932,012 A | 8/1999 | Ishida et al. |
| 5,935,375 A | 8/1999 | Nakazawa et al. |
| 6,007,631 A | 12/1999 | Prentice et al. |
| 6,830,305 B1 * | 12/2004 | Takizawa .................... 347/10 |

* cited by examiner

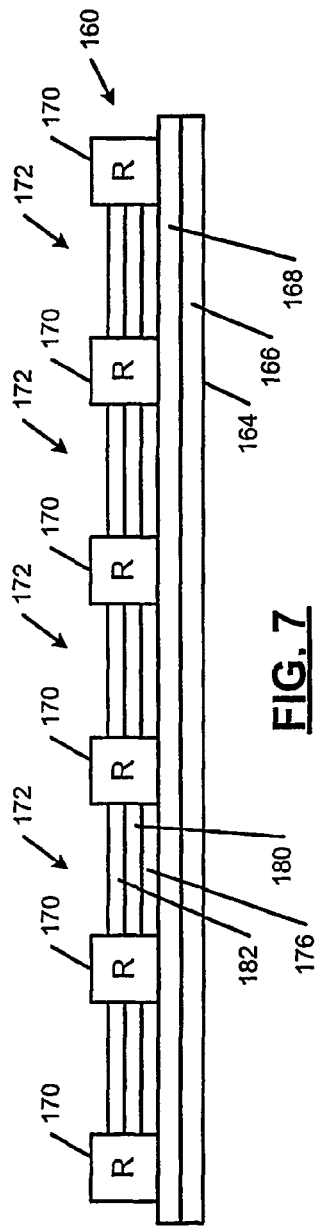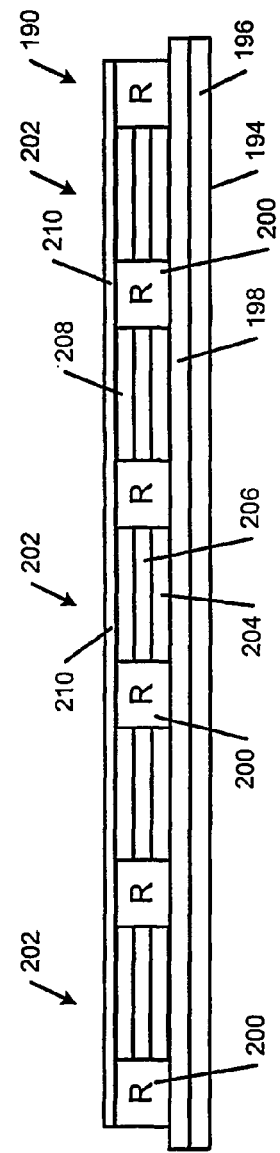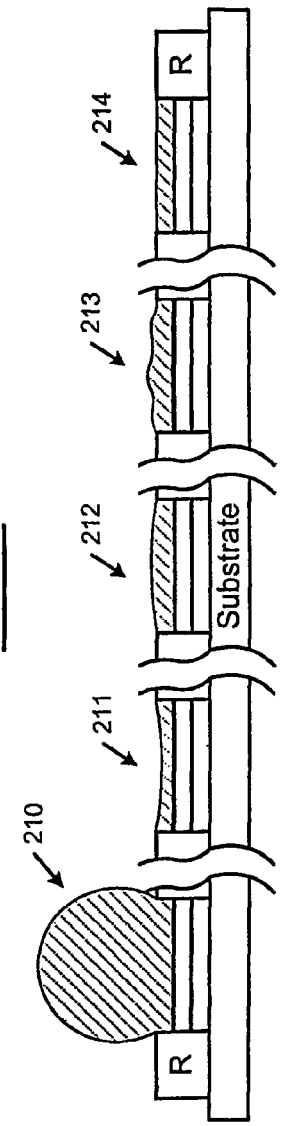

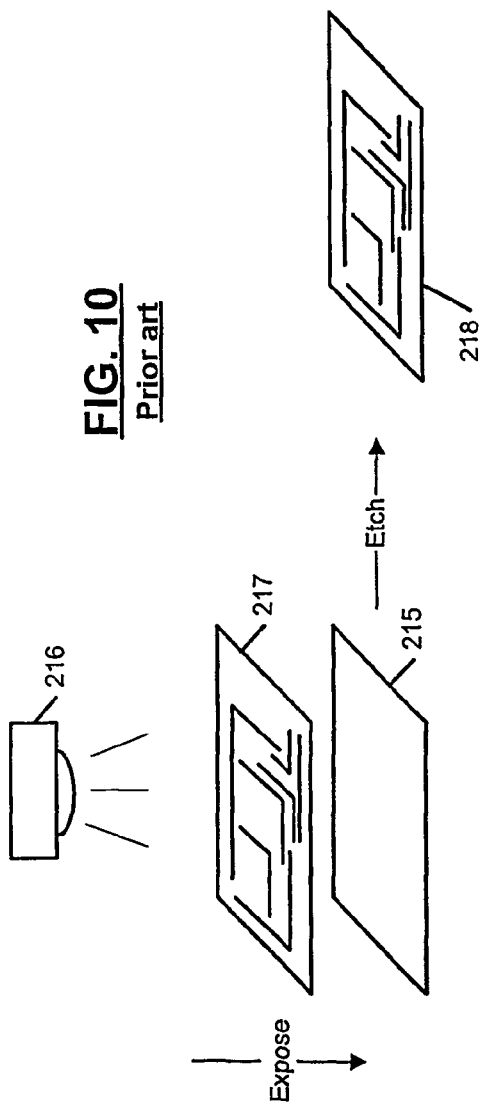
FIG. 10
Prior art
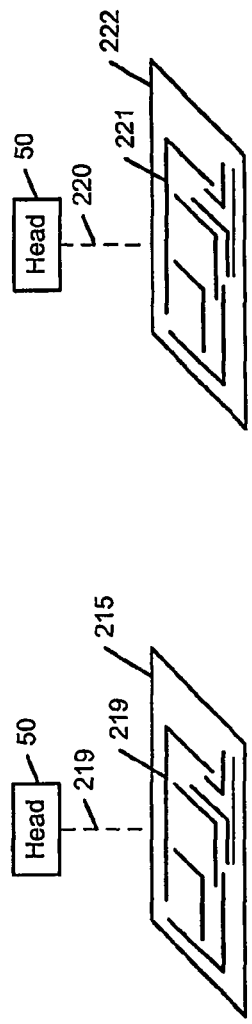
FIG. 12
FIG. 11

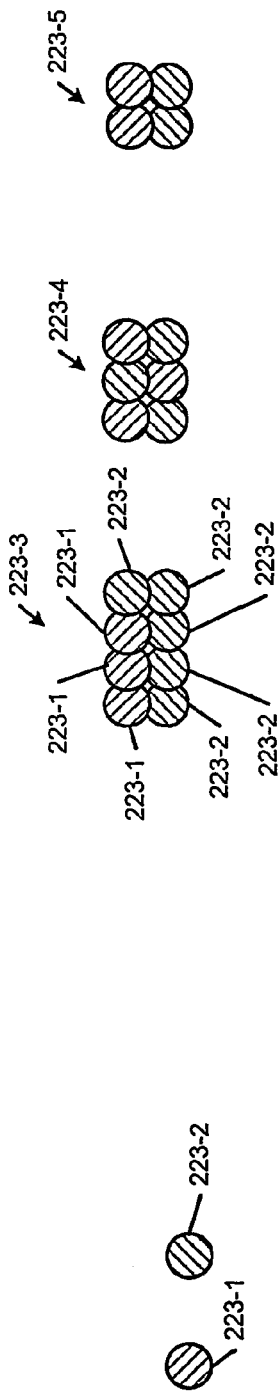
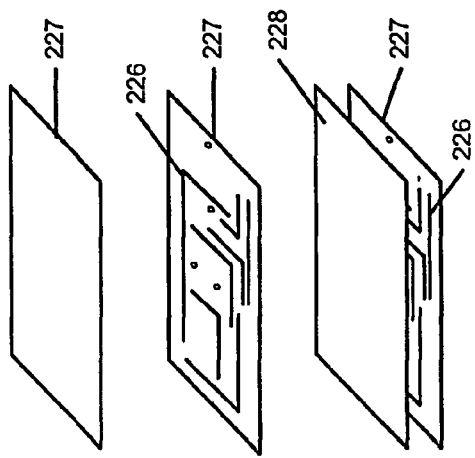
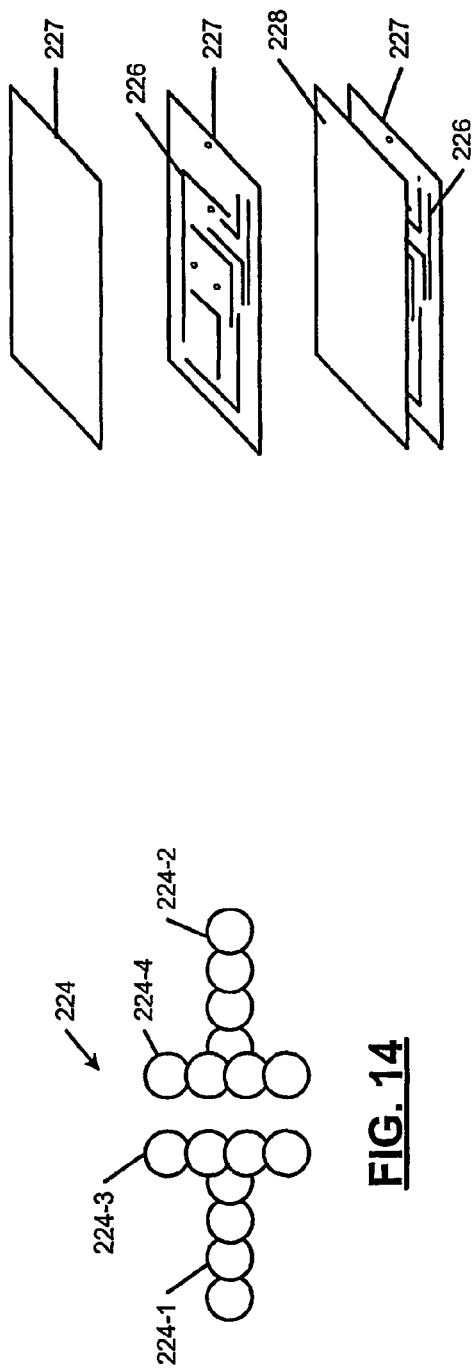

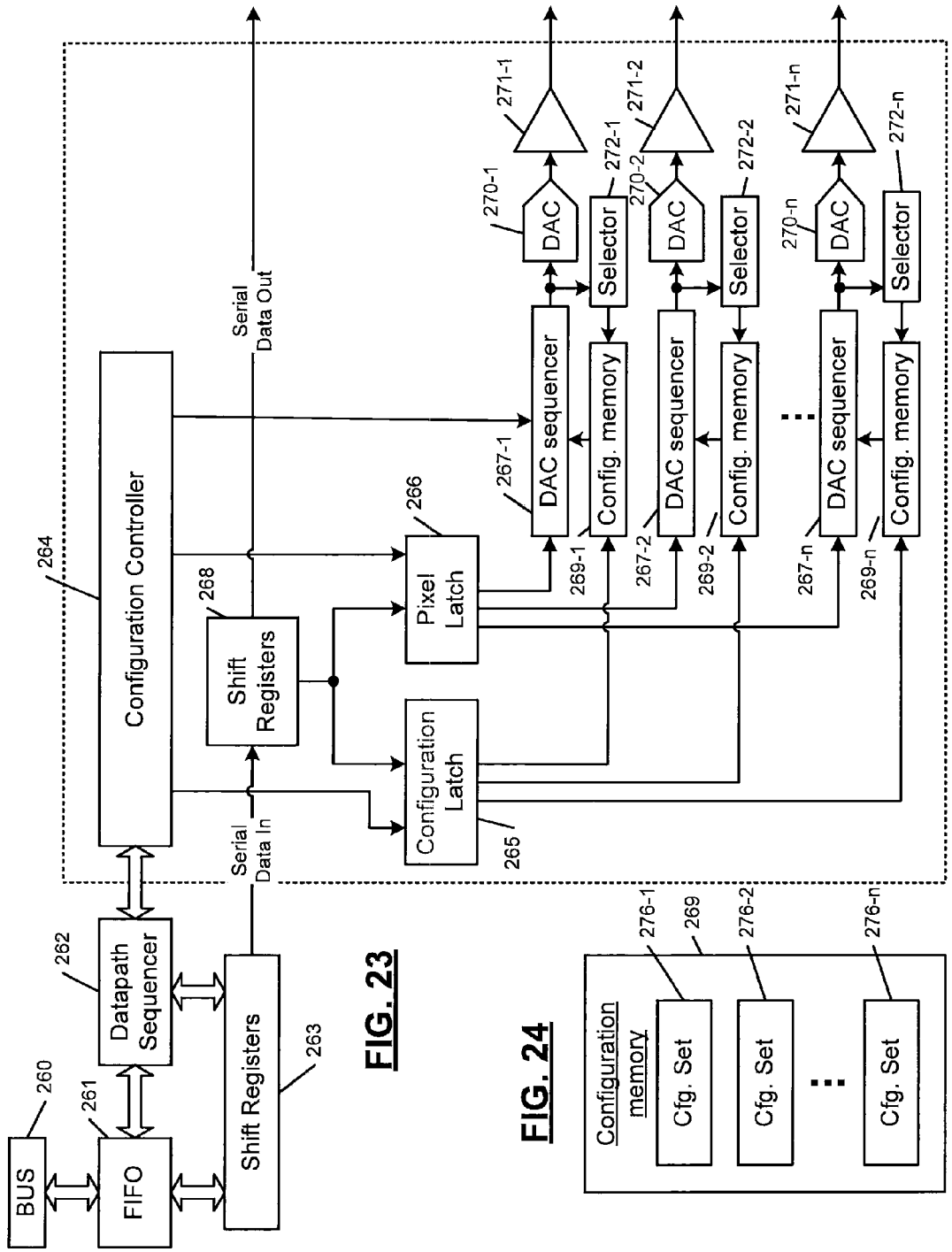

| Address Offset [dec] | Parameter Name | Value Range [dec] | Units |
|---|---|---|---|
| 1 | Pslope | 1-15 | 5V/us |
| 3 | Nslope | 1-15 | 5V/us |

| Address Offset [dec] | Parameter Name | Value Range [dec] | Units |
|---|---|---|---|
| 5 | V1 | 0-255 | 528mV |
| 7 | T1 | 0-255 | 0.1 μs |
| 9 | V2 | 0-255 | 528mV |
| 11 | T2 | 0-255 | 0.1 μs |
| 13 | V3 | 0-255 | 528mV |
| 15 | T3 | 0-255 | 0.1 μs |
| 17 | V4 | 0-255 | 528mV |
| 19 | T4 | 0-255 | 0.1 μs |
| 21 | V5 | 0-255 | 528mV |
| 23 | T5 | 0-255 | 0.1 μs |
| 25 | V6 | 0-255 | 528mV |
| 27 | T6 | 0-255 | 0.1 μs |
| 29 | V7 | 0-255 | 528mV |
| 31 | T7 | 0-255 | 0.1 μs |

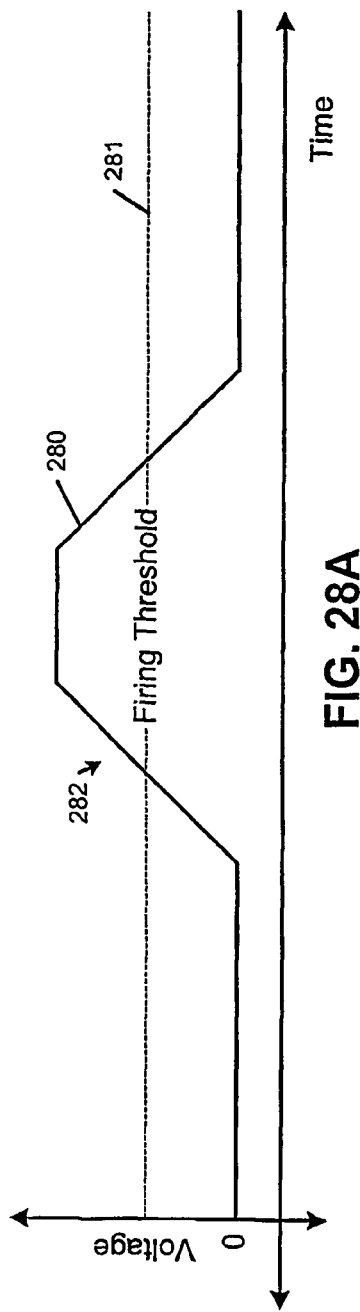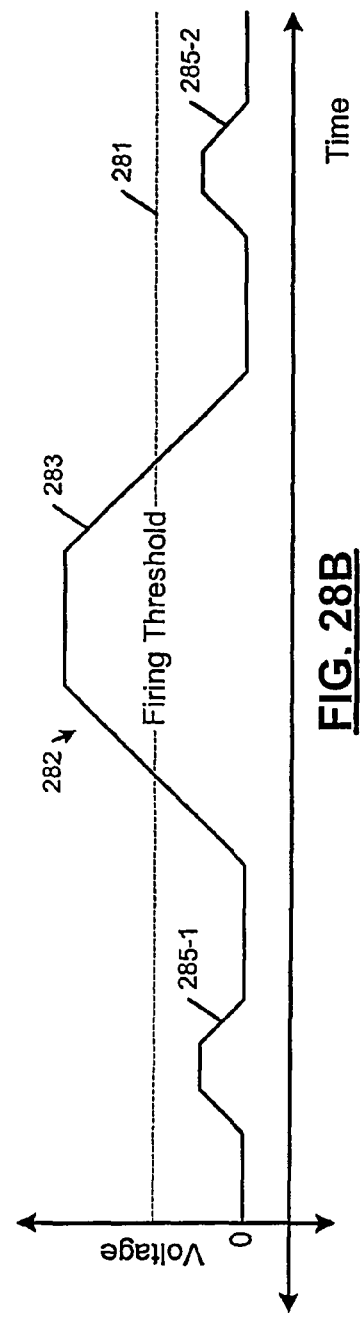

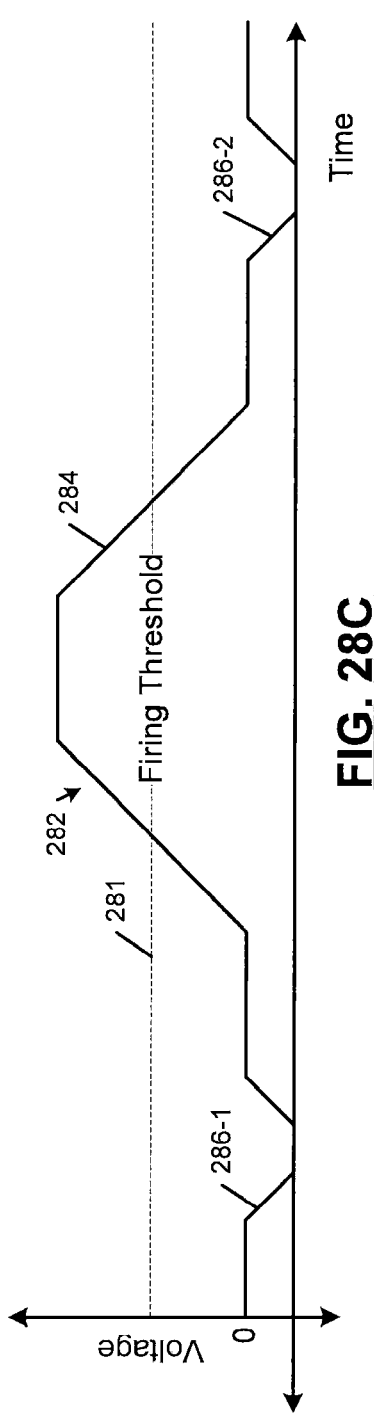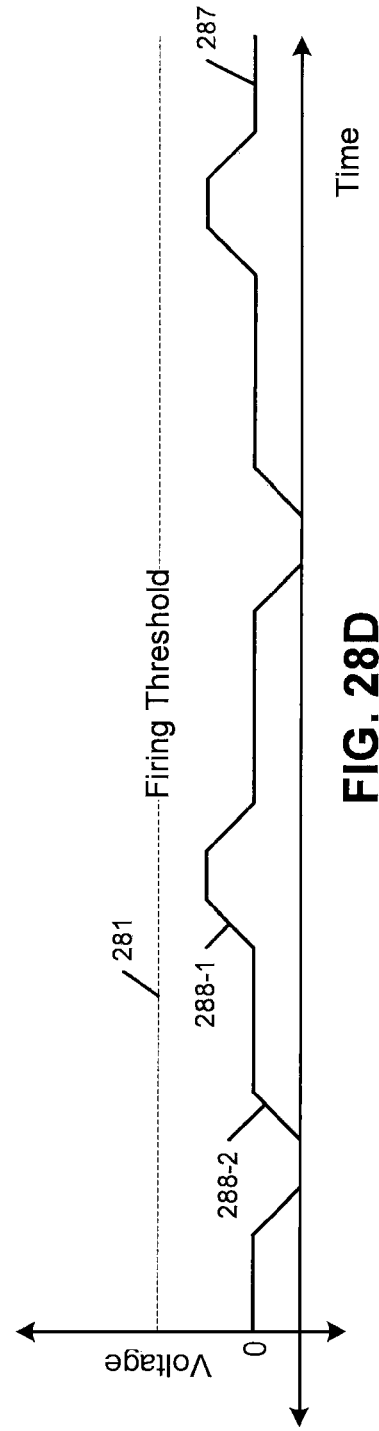

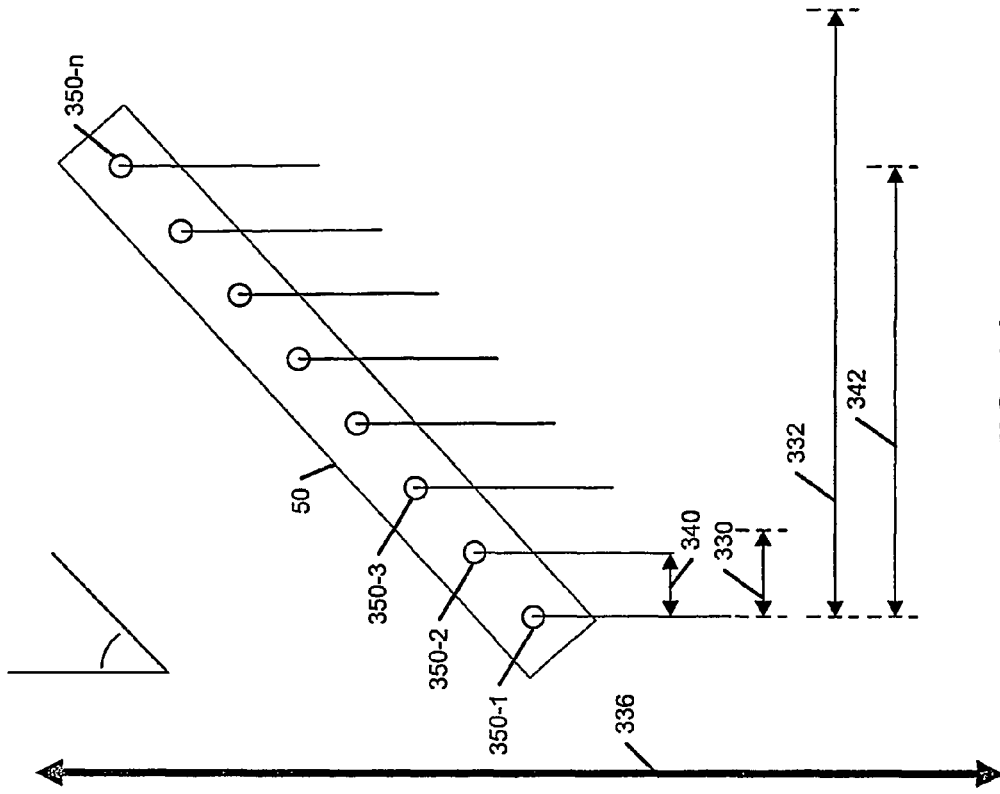
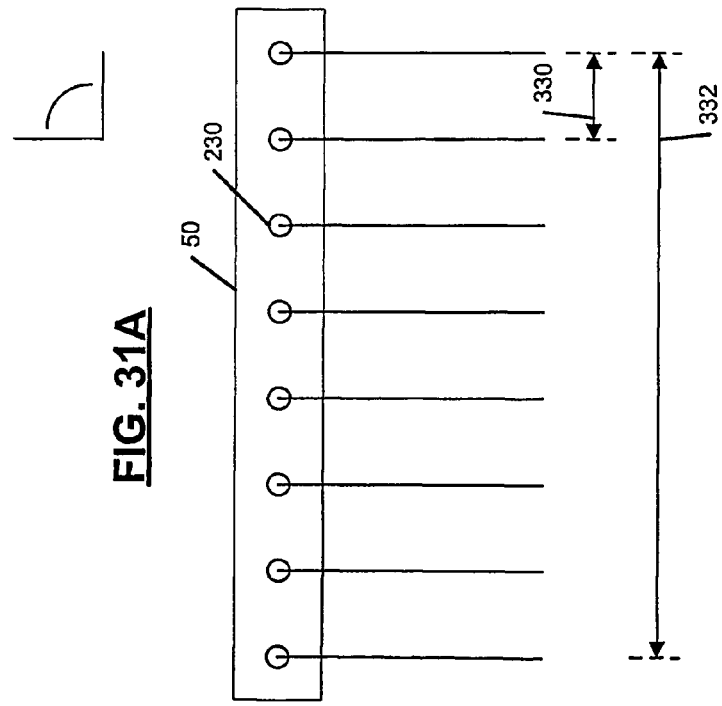

WAVEFORM GENERATOR FOR MICRODEPOSITION CONTROL SYSTEM

CROSS-REFERENCE TO RELATED APPLICATIONS

This application claims the benefit of U.S. Provisional Patent Application Ser. No. 60/295,118, entitled "Formation of Microstructures Using Piezo Deposition of Liquid Onto Substrate," filed Jun. 1, 2001, and U.S. Provisional Application Ser. No. 60/295,100, entitled Formation Of Printed Circuit Board Structures Using Piezo Deposition Of Liquid Onto Substrate, filed Jun. 1, 2001, each of which is incorporated herein by reference.

FIELD OF THE INVENTION

The present invention relates to microdeposition systems, and more particularly to waveform generators for microdeposition systems for fabricating printed circuit boards, polymer light emitting diode (PLED) displays, and other devices requiring microdeposition of fluid material.

BACKGROUND OF THE INVENTION

Manufacturers have developed various techniques for fabricating microstructures that have small feature sizes on substrates. Typically the microstructures form one or more layers of an electronic circuit. Examples of these structures include light-emitting diode (LED) display devices, polymer light-emitting diode (PLED) display devices, liquid crystal display (LCD) devices, printed circuit boards and the like. Most of these manufacturing techniques are relatively expensive to implement and require high production quantities to amortize the cost of the fabrication equipment.

One technique for forming microstructures oh a substrate includes screen printing. During screen printing, a fine mesh screen is positioned on the substrate. Fluid material is deposited through the screen and onto the substrate in a pattern defined by the screen. Screen printing requires contact between the screen and the substrate. Contact also occurs between the screen and the fluid material, which contaminates both the substrate and the fluid material.

While screen printing is suitable for forming some microstructures, many manufacturing processes must be contamination-free to produce operational devices. Therefore, screen printing is not a viable option for the manufacture of certain microstructures. For example, polymer light-emitting diode (PLED) display devices require a contamination-free manufacturing process.

Certain polymeric substances can be used in diodes to generate visible light of different wavelengths. Using these polymers, display devices having pixels with sub-components of red, green, and blue can be created. PLED fluid materials enable full-spectrum color displays and require very little power to emit a substantial amount of light. It is expected that PLED displays will be used in the future for various applications, including televisions, computer monitors, PDAs, other handheld computing devices, cellular phones, and the like. It is also expected that PLED technology will be used for manufacturing light-emitting panels that provide ambient lighting for office, storage, and living spaces. One obstacle to the widespread use of PLED display devices is the difficulty encountered to manufacture PLED display devices.

Photolithography is another manufacturing technique that is used to manufacture microstructures on substrates. Photolithography is also not compatible with PLED display devices. Manufacturing processes using photolithography generally involve the deposition of a photoresist material onto a substrate. The photoresist material is cured by exposure to light. A patterned mask is used to selectively apply light to the photo resist material. Photoresist that is exposed to the light is cured and unexposed portions are not cured. The uncured portions are removed from the substrate.

An underlying surface of the substrate is exposed through the removed photoresist layer. The cured portions of the photoresist layer remain on the substrate. Another material is then deposited onto the substrate through the opened pattern on the photoresist layer, followed by the removal of the cured portion of the photoresist layer.

Photolithography has been used successfully to manufacture many microstructures such as traces on circuit boards. However, photolithography contaminates the substrate and the material formed on the substrate. Photolithography is not compatible with the manufacture of PLED displays because the photoresist contaminates the PLED polymers. In addition, photolithography involves multiple steps for applying and processing the photoresist material. The cost of the photolithography process can be prohibitive when relatively small quantities are to be fabricated.

Spin coating has also been used to form microstructures. Spin coating involves rotating a substrate while depositing fluid material at the center of the substrate. The rotational motion of the substrate causes the fluid material to spread evenly across the surface of the substrate. Spin coating is also an expensive process because a majority of the fluid material does not remain on the substrate. In addition, the size of the substrate is limited by the spin coating process to less than approximately 12", which makes spin coating unsuitable for larger devices such as PLED televisions.

SUMMARY OF THE INVENTION

A microdeposition system and method includes a head with a plurality of nozzles. A controller generates nozzle firing commands that selectively fire the nozzles to create a desired feature pattern. Configuration memory stores voltage waveform parameters that define a voltage waveform for each of the nozzles.

In other features, a digital to analog converter (DAC) sequencer communicates with the configuration memory and the controller and outputs a first voltage waveform for a first nozzle when a nozzle firing command for the first nozzle is received from the controller. A resistive ladder DAC receives the voltage waveforms from the DAC sequencer. An operational amplifier (opamp) communicates with the resistive ladder DAC and amplifies the voltage waveforms. The nozzles fire droplets when the voltage waveforms received from the opamp exceed a firing threshold of the nozzle.

In other features, the nozzles include a common line and a nib line. The common line is connected to one of earth ground and a floating positive voltage relative to a system power ground. The opamp drives the nib line to a negative voltage that exceeds the firing threshold voltage to fire the nozzle.

In still other features, a first voltage waveform that is associated with a first nozzle includes at least one of a positive conditioning pulse and a negative conditioning pulse that does not exceed the firing threshold. The positive conditioning pulse or the negative conditioning pulse precedes or follows a firing pulse that exceeds the firing threshold.

In still other features, a configuration latch receives a set of voltage waveform parameters from the controller and loads the set of voltage waveform parameters in the configuration memory. A pixel latch communicates with the DAC sequencer and receives nozzle firing commands from the controller. The configuration memory stores a plurality of sets of voltage waveform parameters for each of the nozzles. A configuration set selector selects one of the sets of voltage waveform parameters based on operating conditions of the nozzle.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIGS. 7 and 8 are exemplary cross-sections of monochrome and color polymer light emitting diodes (PLEDs);

FIG. 9 illustrates controlled drying of a fluid material such as (PPV) polymer that has been deposited on a substrate;

FIG. 10 illustrates a manufacturing process for a printed circuit board according to the prior art;

FIG. 11 illustrates the use of the microdeposition system for depositing a resist fluid material onto a copper clad dielectric substrate for a printed circuit board;

FIG. 12 illustrates the use of the microdeposition system for depositing a conductive fluid material onto a dielectric substrate to create traces for a printed circuit board;

FIGS. 13A and 13B illustrate the microdeposition of resistive fluid materials to create resistors on printed circuit boards;

FIG. 14 illustrates the microdeposition of a capacitor;

FIG. 15 illustrates a printed circuit board replacement according to the present invention using a laminated insulator over microdeposited traces;

FIG. 23 is a functional block diagram of an exemplary waveform generator;

FIG. 24 illustrates the configuration memory including one or more configuration sets;

FIG. 27 illustrates an exemplary configuration set data structure;

FIG. 28A-28D illustrate exemplary waveforms associated with multiple configurations sets;

FIGS. 31A and 31B illustrates pitch adjustment of the microdeposition head;

DETAILED DESCRIPTION OF THE PREFERRED EMBODIMENTS

Figure 1:
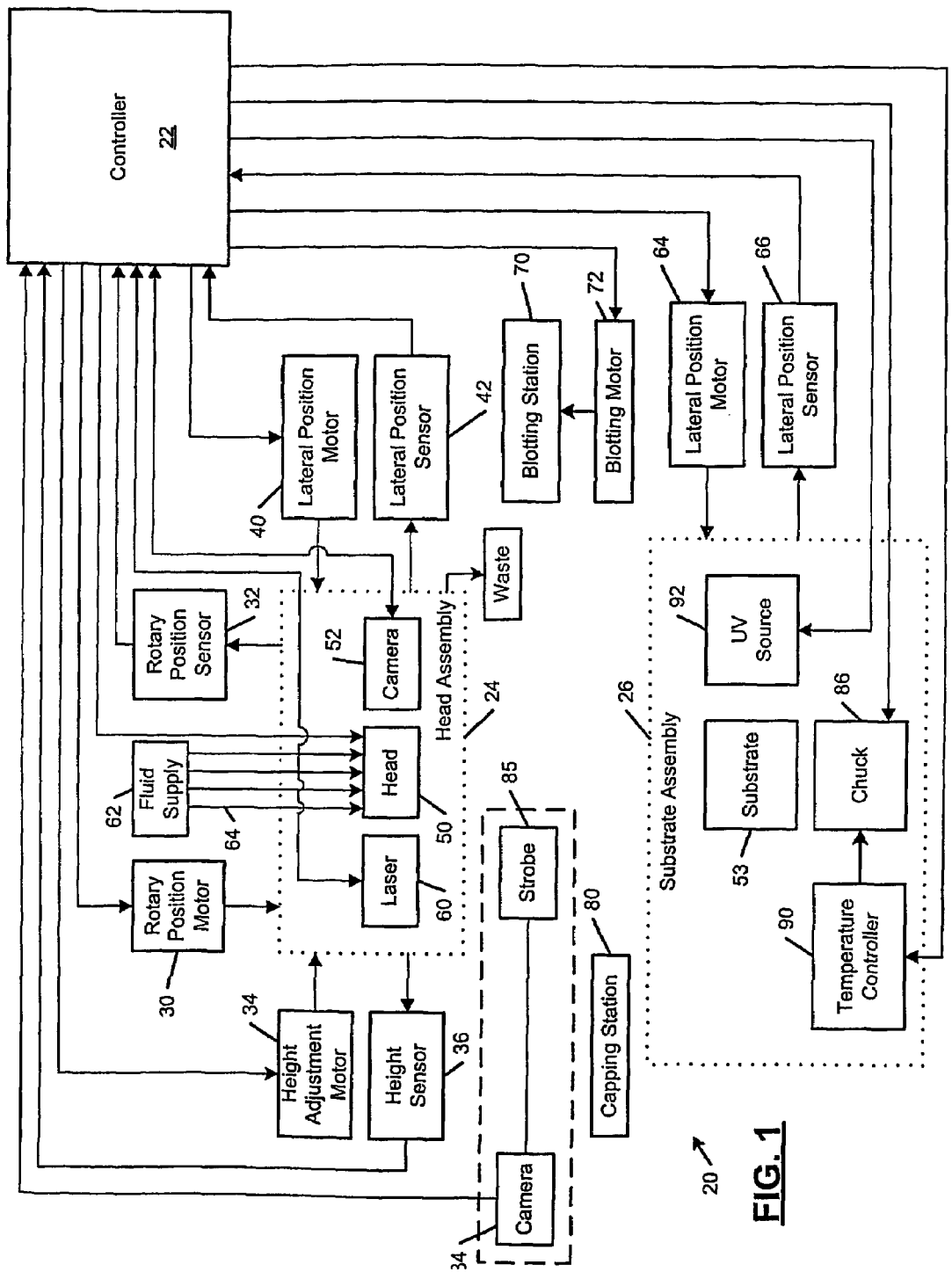
FIG. 1 is a functional block diagram of a microdeposition system according to the present invention.

The following description of the preferred embodiment(s) is merely exemplary in nature and is in no way intended to limit the invention, its application, or uses. For purposes of clarity, the same reference numbers will be used in the drawings to identify similar elements.

Referring now to FIG. 1, a microdeposition system 20 is illustrated and includes a controller 22, a head assembly 24, and a substrate assembly 26. A rotational position or pitch of the head assembly 24 is adjusted using a rotary position motor 30 and a rotary position sensor 32. Likewise, a height of the head assembly 24 relative to the substrate assembly 26 may be adjusted using a height adjustment motor 34 and a height sensor 36. A lateral position of the head assembly 24 is adjusted using a lateral position motor 40 and a lateral position sensor 42.

A microdeposition head 50 with a plurality of nozzles is mounted on the head assembly 24. Additional details are found in contemporaneously filed PCT patent application No. U.S. Pat. No. 0,217,519, filed May 31, 2002, entitled Microdeposition Apparatus; now Pat. App. Pub. No. U.S.2004/0231594; PCT patent application No. U.S.0217522, filed May 31, 2002, entitled Temperature Controlled Vacuum Chuck, now U.S. Pat. No. 7,160,105; PCT patent application No. U.S.0217523, filed May 31, 2002, entitled Industrial Microdeposition System For Polymer Light Emitting Diode Displays, Printed Circuit Boards And The Like; now U.S. Pat. No. 7,270,712; PCT patent application No. U.S.0217373, filed May 31, 2002, entitled Interchangeable Microdeposition Head Apparatus And Method; U.S. Pub. App. 2005/0016451, now abandoned; PCT patent application No. U.S.0217521, filed May 31, 2002, entitled Over-Clocking In A Microdeposition Control System To Improve Resolution, now U.S. Pat. No. 7,244,310, PCT patent application No. U.S. 0217369, filed May 31, 2002, entitled Formation Of Printed Circuit Board Structures Using Piezo Microdeposition; U.S. Pub. App. 2004/0231593, now abandoned; and PCT patent application No. U.S.0217370, filed May 31, 2002, entitled Apparatus For Microdeposition Of Multiple Fluid Materials, U.S. Pub. App. No. 2004/0231593, now abandoned; each of which is incorporated herein by reference. A first camera 52 is mounted on the head assembly 24. The first camera 52 is used to position the head assembly 24 relative to a substrate 53 that is located on the substrate assembly 26. More particularly, the first camera 52 is used to align the microdeposition head 50 using one or more nozzles of the head 50 as a reference. In addition, the first camera 52 is used to perform drop analysis on the substrate, as will be described more fully below.

A laser 60 can be used for laser ablation of applied fluid material to reduce minimum feature sizes and/or for creating vias. While the laser 60 is mounted on the head assembly 24 in FIG. 1, the laser 60 can be mounted on a laser assembly that moves independently from the head assembly 24. A fluid supply 62 is connected by one or more conduits 64 to the microdeposition head 50. The fluid supply 62 provides one or more different types of fluid materials, such as polymer PPV for red, green and blue pixels, solvent, resistive fluid materials, conductive fluid materials, resist fluid materials, and/or insulating fluid materials. The fluid supply 62 is preferably capable of changing the fluid material that is supplied by using a solvent flush before switching a new fluid material.

A lateral position motor 64 and a lateral position sensor 66 are used to position the substrate assembly 26 with respect to the head assembly 24. In a preferred embodiment, the lateral position motor 40 moves along a first axis. The lateral position motor 64 moves along a second axis that is perpendicular to the first axis. As can be appreciated by skilled artisans, the position motors 30, 34, 40 and 64 are associated with either the head assembly 24 or the substrate assembly 26. In other words, the degrees of relative movement and rotation may be provided by moving or rotating the substrate assembly 26 and/or the head assembly 24 and any combination thereof.

A blotting station 70 and a blotting media motor 72 are preferably located adjacent to the substrate assembly 26. To prevent clogging of nozzles of the microdeposition head 50, the microdeposition head 50 is cleaned periodically during use. The microdeposition head 50 is moved into position over the blotting station 70 and a nozzle plate (not shown) of the microdeposition head is wiped on the blotting station 70. The blotting station 70 includes a roll of blotting material. A blotting motor 72 advances the roll of blotting material to provide a clean surface for blotting of the nozzle plate of the microdeposition head 50.

A capping station 80 is also located adjacent to the head assembly 24. The microdeposition head 50 is parked in the capping station 80 when the microdeposition system 20 is not in use. The capping station 80 includes a cup containing wet fluid material and/or solvent. The capping station 80 is used to prevent the fluid material that is delivered by the microdeposition head 50 from clogging the nozzles of the microdeposition head 50. A second camera 84 is used for droplet analysis and is located adjacent to the capping station 80. Preferably, the first and second cameras 52 and 84 and the controller 22 provide digital optical recognition, as will be described more fully below. A strobe 85 may be provided to capture the droplets.

The substrate assembly 26 includes a chuck 86, which engages and positions the substrate 53. The substrate assembly 26 preferably includes a curing device such as a temperature controller 90 and/or an ultraviolet (UV) source 92. The temperature controller 90 controls the temperature of the chuck 86. A temperature of approximately 50° C. is typically suitable to reduce drying times for substrates having thicknesses between 0.3 and 1.2 mm. The chuck 86 preferably includes a vacuum circuit that positions and engages the substrate 53. Alternately, the chuck 86 may include other types of devices that position and engage the substrate 53 during microdeposition. For example, fluid surface tension, magnetism, physical engagement of the substrate or any other approach may be used to engage the substrate 53 during microdeposition. Additional details concerning the chuck are found in "Temperature Controlled Vacuum Chuck", has been incorporated by reference above.

Skilled artisans will appreciate that manual adjustment devices such as a hand adjustment (for example, a knob that turns a worm gear or any other mechanical adjustment) can be used to replace one or more of the motors 30, 34, 40, and 64 to reduce cost. Visual devices such as a scale can be used to replace one or more of the sensors 32, 36, 42, and 66 to reduce cost. In addition, the function of the motors 30, 34 and/or 40 may be combined in a multi-axis motor if desired. In a preferred embodiment, one or more of the positioning devices are implemented using an air bearing and a linear motor. Still other variations will be apparent to skilled artisans. The functionality that is provided by the motors and sensors is similar to a computer numerical controlled (CNC) milling machine. Preferably, the motors provide adjustment in three or more axes. Additional ranges of motion can be provided for three-dimensional (3D) microdeposition or microdeposition of complex curved shapes.

The microdeposition head 50 is preferably positioned over the substrate at a distance of between approximately 0.5 mm and 2.0 mm. In a highly preferred embodiment, the microdeposition head is positioned a distance that is at least 5 times the size of the droplet of the fluid material, although other heights may be used. When smaller pitch sizes are required, the microdeposition head 50 is rotated to reduce the pitch. When larger pitches are required, the microdeposition head 50 is rotated and some of the nozzles are not used, for example every other nozzle is not used.

Figure 2:
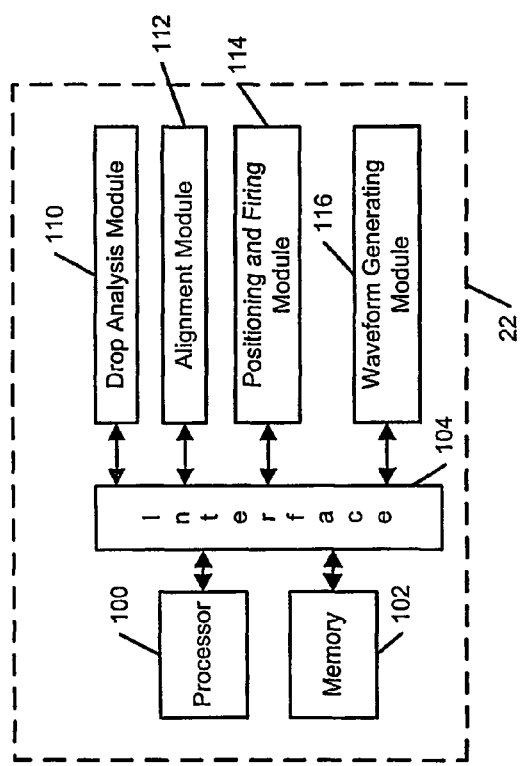
FIG. 2 is a functional block diagram of a controller for the microdeposition system of FIG. 1.

Referring now to FIG. 2, the controller 22 is illustrated in further detail. The controller 22 includes one or more processors 100, memory 102 (such as random access memory (RAM), read-only memory (ROM), flash memory, and/or any other suitable electronic storage medium), and an input/output interface 104. As can be appreciated, while a single controller 22 is shown, multiple controllers may be used. A drop analysis module 110 performs drop analysis using the first camera 52 and/or second camera 84, as will be described more fully below.

An alignment module 112 preferably aligns the substrate and the head 50 using optical character recognition (before depositing the fluid material) using the first camera 52 and/or the second camera 84. A nozzle position and firing module 114 adjusts the position of the head assembly 24 with respect to the substrate 53 and generates nozzle firing waveforms to create features on the substrate. A waveform generating module 116 operates in conjunction with the nozzle position and firing module 114 and adjusts the timing, rise slope, fall slope, and/or amplitude of nozzle firing waveforms, as will be described more fully below. The waveform generating module 116 also optionally adjusts nozzle firing timing for changes in the pitch of the head.

Figure 4:
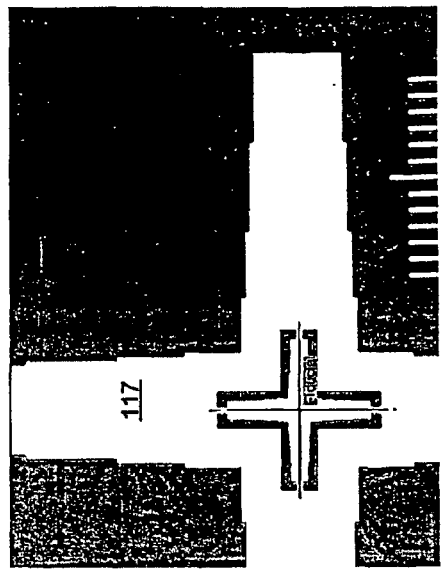
FIG. 4 illustrates alignment of the head using optical character recognition and the marks.
Figure 3:
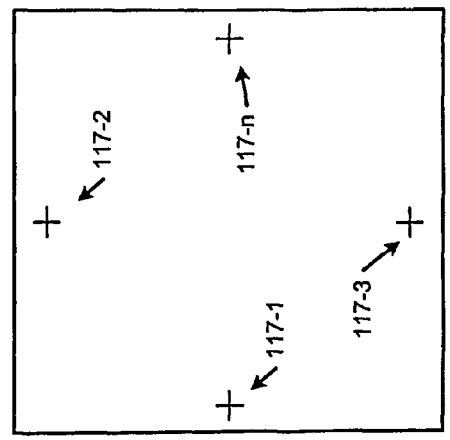
FIG. 3 illustrates marks on a substrate that are used to position the microdeposition head.

Referring now to FIGS. 3 and 4, the substrate 53 preferably includes a plurality of marks 117-1, 117-2, 117-3, . . . 117-n that are used by the first camera 52 and/or the second camera 84 to align the substrate 53 and the head 50 before depositing the fluid material(s). Rough initial positioning may be performed manually if desired. Alternately, the alignment module 112 may use optical character recognition to perform rough and/or fine alignment using the marks 117.

Figure 5:
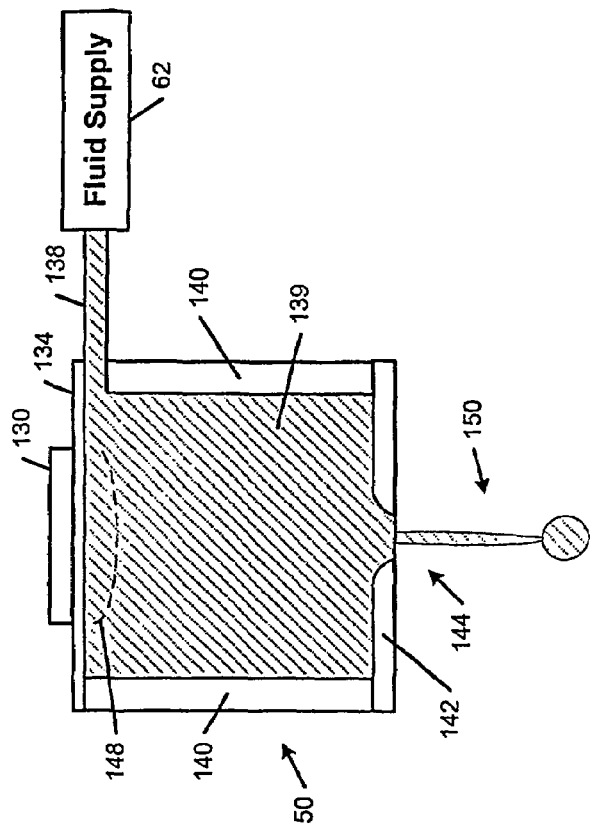
FIG. 5 illustrates a nozzle of an exemplary microdeposition head.

Referring now to FIG. 5, an exemplary microdeposition head 50 is shown in further detail. The present invention will be described in conjunction with a shear mode piezo transducer (PZT) microdeposition head. Skilled artisans will appreciate that other types of microdeposition heads are contemplated such as thermal or bubble microdeposition heads, continuous drop microdeposition heads, PZT valves, and microelectromechanical valves. The microdeposition head 50 includes a PZT 130 that is located on a diaphragm 134. While only one nozzle is shown, skilled artisans will appreciate that the microdeposition head 50 includes a plurality of nozzles.

The fluid supply 62 provides one or more fluid materials via one or more conduits 138 to a fluid channel 139 that is formed between the diaphragm 134 and rigid walls 140. A nozzle plate 142 includes a nozzle opening 144 formed therein. Electrical lead(s) (not shown) connect the PZT 130 to the controller 22. The controller 22 transmits nozzle firing waveforms that produce an acoustic pulse 148. The acoustic pulse travels through the fluid material in the fluid channel 139 and fires a droplet 150. The shape, volume and timing of the droplet is controlled by the nozzle firing waveform.

The microdeposition head 50 dispenses precise droplets 150 of fluid onto the substrate 53. More particularly, the microdeposition head assembly 24 is precisely positioned relative to the substrate 53 using the controller 22 of the microdeposition system 20. As a result, the microdeposition head 50 is able to place droplets in precise locations on the substrate 53.

Figure 6:
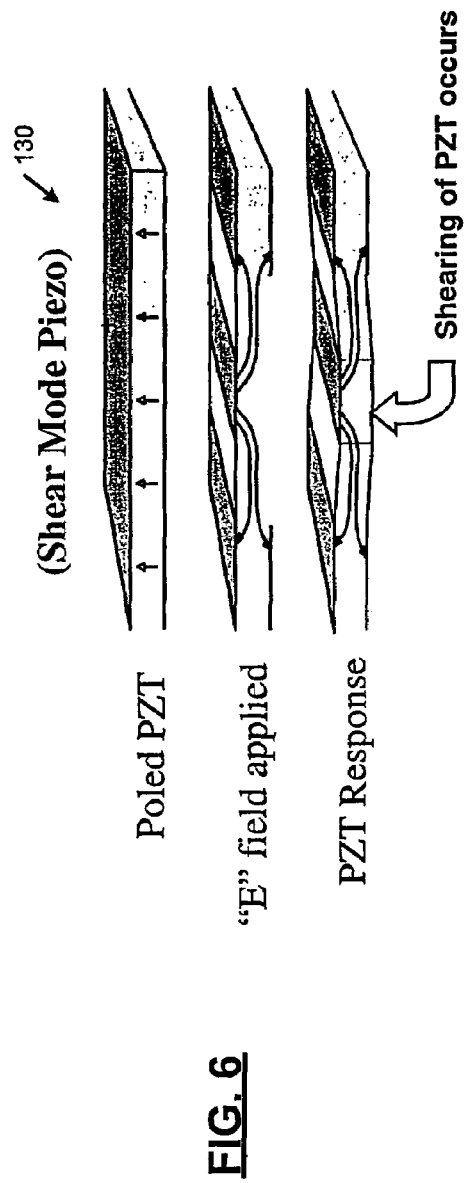
FIG. 6 illustrates shearing of a piezo transducer during firing of the exemplary microdeposition head of FIG. 5.

When the nozzle firing waveforms are triggered by the controller 22, shear mode actuation causes the droplet 150 to be dispensed. Typically, the microdeposition head 50 will include between 64 and 256 nozzles, although additional or fewer nozzles may be utilized. Each nozzle 144 of the microdeposition head 50 is capable of dispensing between 5000-20,000 drops per second, although higher or lower drop dispensing rates may be provided. Typically, each droplet contains between 10 and 80 picoliters of fluid material depending upon the type of microdeposition device that is used, although increased or decreased droplet volume may be provided. Referring now to FIG. 6, the shear mode PZT 130 is illustrated further. When an electric field is applied, the PZT 130 responds by shearing, which creates the acoustic wave 148.

Referring now to FIGS. 7 and 8, exemplary devices that can be fabricated using the microdeposition system 20 are shown. In FIG. 7, a monochrome PLED 160 is shown and includes a substrate 164, which may include one or more glass layers 166 and/or silicon layers 168. Resists 170 are fabricated on the substrate 164 using any suitable fabrication technique such as photolithography, etching, etc. Wells 172 are formed between the resists 170. The microdeposition head 50 deposits one or more fluid materials into the wells 172. For example, a first layer 176 is indium tin oxide (ITO). A second layer 180 is polyaniline (PANI). A third layer 182 is PPV polymer.

Referring now to FIG. 8, a color PLED 190 is shown and includes a substrate 194 with one or more glass layers 196 and/or silicon layer(s) 198. Resists 200 are fabricated on the substrate 194 and form wells 202. The microdeposition system 20 is used to form multiple layers in the wells 202. For example, a first layer 204 includes ITO. A second layer 206 includes PPV polymer. A third layer 208 includes ITO. A fourth layer 210 provides a cap layer.

Referring now to FIG. 9, some fluid materials that will be dispensed by the microdeposition head 50 shrink substantially as the fluid material dries. To that end, curing devices are preferably provided with the substrate assembly 26 to control curing and shrinkage. The temperature controller 90 and/or ultraviolet (UV) source 92 are provided to facilitate proper curing of the fluid material that is deposited in the wells. For example, the temperature controller 90 heats the chuck 86, which warms the substrate 53 through contact. Alternately, the UV source 92 generates ultraviolet light that is directed at the fluid material that is deposited on the substrate 53 to facilitate curing. Additionally, airflow in a vicinity surrounding the substrate assembly may be controlled (prevented) using an enclosure, a fan, or other suitable airflow equipment. Equipment that is typically used in a clean room may be employed.

When the fluid material is initially applied, it may form a bubble as shown at 210. If left to dry at ambient conditions, the dry fluid material may appear as shown at 211, 212 or 213. If processed properly, the dry fluid material has the appearance shown at 214. The specific combination of airflow, UV light and/or temperature that provide the uniform surface 214 are dependant upon the fluid material that is selected.

Referring now to FIG. 10, manufacturing of a conventional printed circuit board (PCB) is illustrated. A photoresist is applied to a copper clad dielectric substrate 215. A light source 216 and a mask 217 are used to expose select portions of the photoresist. The exposure of the select portions causes the photoresist to harden. The unexposed portions of the photoresist are etched to produce a PCB 218 with traces.

Referring now to FIG. 11, using the microdeposition system 20 according to the present invention, a resist replacement 219 such as an acrylic polymer is microdeposited onto the copper clad dielectric material 215 before etching. As a result, the mask and exposure process is eliminated.

Alternately, the microdeposition system 20 is used to deposit a metallic ink or another metallic conducting fluid 220 containing a metal powder to create traces 221 on a dielectric substrate 222. The copper foil or cladding need not be provided on the dielectric substrate 222 and the mask and etching steps need not be performed. The metallic ink or metallic conducting fluid 220 creates conductor paths or traces on the dielectric material 222. Suitable metallic fluids include solutions of copper, silver, and indium oxide. Depending upon the fluid material that is used, a flash baking process is preferably used to cure and unify the traces 221.

In addition, fluids having resistive properties such as resistive inks are used to create resistors and capacitors. For example, in FIGS. 13A and 13B, a plurality of resistive fluid material such as resistive inks are used to deposit resistive droplets 223-1 and 223-2. The droplets are combined to create resistors 223-3, 223-4, and 223-5 having various resistor values. For example, if the first droplets 223-1 provide a 10 k Ohm (Ω) resistance and the second droplets 223-2 provide a 1 kΩ resistance, the resistor 223-5 is a 5 kΩ resistor, the resistor 223-4 is a 6 kΩ resistor and the resistor 223-3 is a 7 kΩ resistor. As can be appreciated by skilled artisans, other resistor values for the droplets and other droplet combinations can be created. The microdeposition system may also be used to deposit legends, solder mask, solder paste and other fluid materials that are used in printed circuit board manufacturing. Laser trimming of the deposited droplets is preferably employed to improve accuracy. In FIG. 14, capacitors 224 are created by microdepositioning using conductive traces 224-1 and 224-2 and spaced plates 224-3 and 224-4.

In an alternate embodiment in FIG. 15, traces 226 are deposited on a blank substrate or a back of a display (both identified by 227) using the microdeposition system 20. An insulating layer 228 is laminated over the traces using a fluid material with insulating properties such as an acrylic polymer. Additional traces and insulating layers can be added if needed. If polyimide film such as Kaptone is used as the laminated insulating layer 228, the laser 60 is used to create vias between traces on different layers. Alternately, the insulating layer is microdeposited directly onto the substrate over the traces 226 or over the entire surface.

Figure 16:
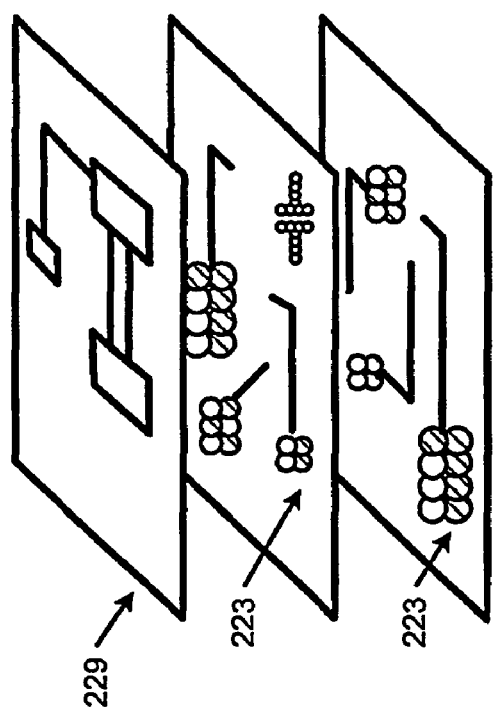
FIG. 16 illustrates a multilayer printed circuit board including internal microdeposited resistors, capacitors and/or traces.

Referring now to FIG. 16, the resistors 223 and the capacitors 224 are fabricated using microdeposition between layers of a multilayer POB that may include discrete circuit components. The fabrication of the resistors between the layers allows valuable outer surface area to be used for the discrete circuit components. Additional details are found in "Industrial Microderosition System For Polymer Light Emitting Diode Displays, Printed Circuit Boards, And The Like," which has been incorporated by reference above.

Figure 17:
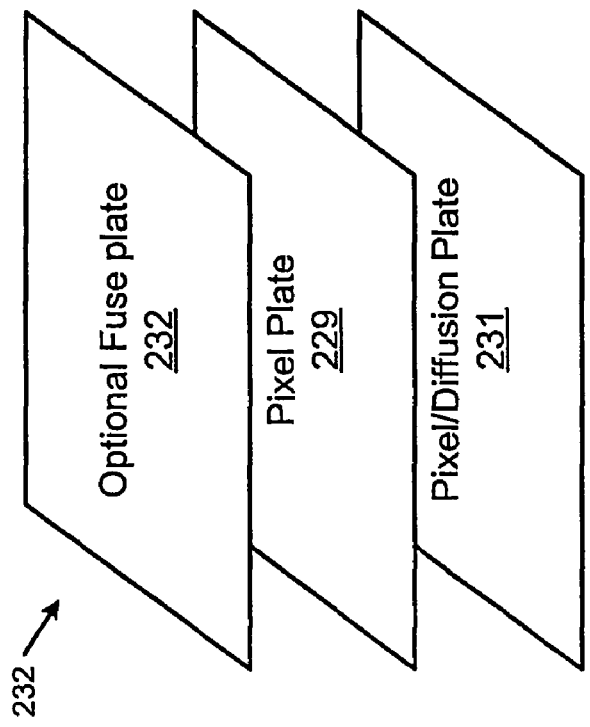
FIG. 17 illustrates a light panel including microdeposited pixels on a pixel plate and/or microdeposited fuses on an optional fuse plate.

Referring now to FIG. 17, the microdeposition system of the present invention may also be used to fabricate a pixel plate 229 of a light panel 230. The light panels also include a pixel diffusion plate 231 and an optional fuse plate 232. The optional fuse plate may include fuses and traces that are microdeposited.

Figure 18:
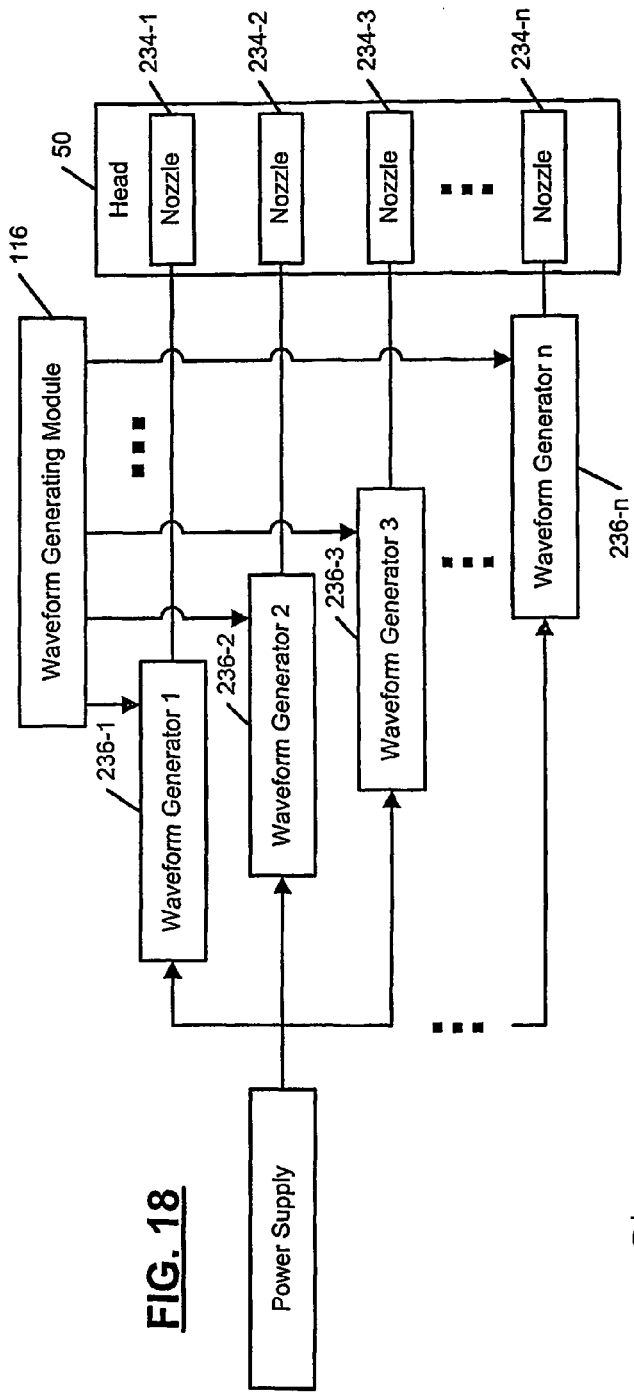
FIG. 18 illustrates a waveform generator that is capable of generating different firing waveforms for each nozzle.
Figure 19:
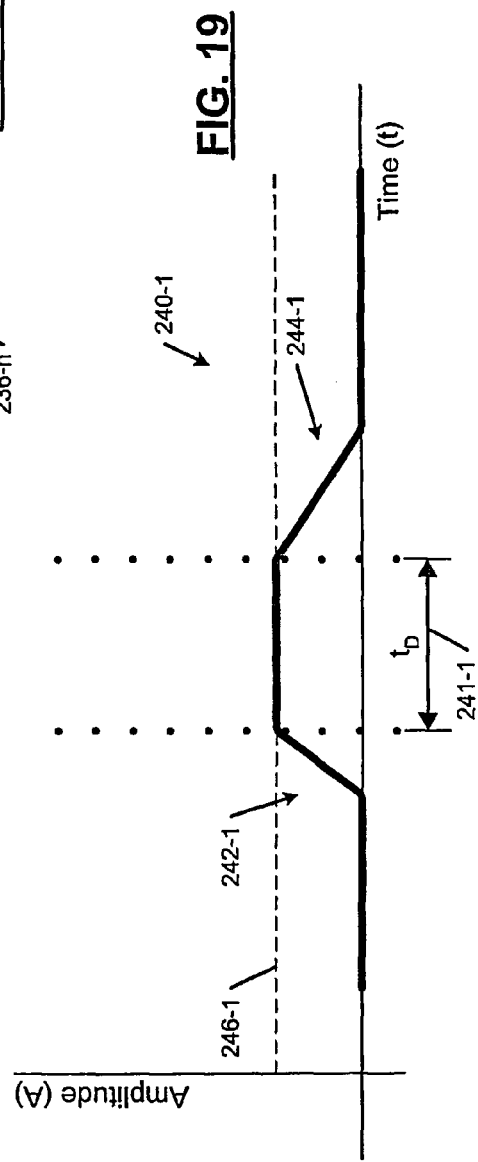
FIG. 19 illustrates rise slope, duration, timing and fall slope of an exemplary nozzle firing waveform.

Referring now to FIGS. 18 and 19, nozzle firing waveforms for each of the nozzles 234-1, 234-2, 234-3, . . . , and 234-$n$ are individually controlled by the controller 22. By controlling the nozzle firing waveforms individually, the uniformity of droplets 150 is significantly improved. In other words, if the droplets 150 from a particular nozzle have a non-uniform or undesirable shape, the nozzle firing waveform for the corresponding nozzle is adjusted to provide a droplet 150 with a uniform or desired shape. The waveform generating module 116, the drop analysis module 110 and/or the position and firing modules 114 collect data using the first and/or second cameras 52 and 84 and optical recognition. Adjustments may be made automatically using software and feedback from droplet analysis.

More particularly, the waveform generating module 116 communicates with waveform generators 236-1, 236-2, 236-3, . . . , and 236-$n$ to individually adjust timing, duration, amplitude, rise slope and/or fall slopes of the nozzle firing waveforms for each of the nozzles 234. In FIG. 19, an exemplary nozzle firing waveform 240-1 is shown. The exemplary nozzle firing waveform 240-1 has a duration timing $t_D$ 241-1, a rise slope 242-1, a fall slope 244-1 and amplitude 246-1.

Figure 20:
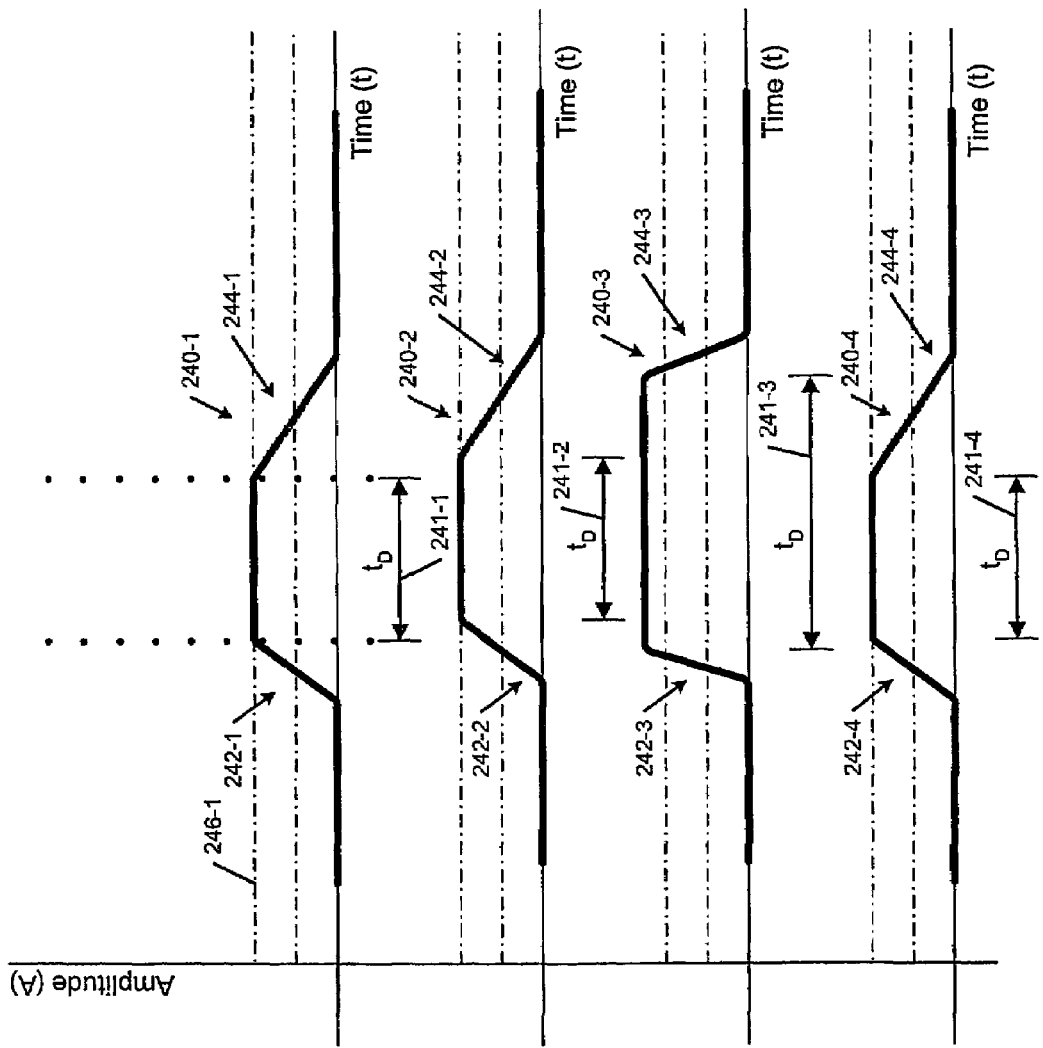
FIG. 20 illustrates modification of rise slope, duration, timing and/or fall slope for several exemplary nozzle firing waveforms using the waveform generator of FIG. 18.

Referring now to FIG. 20, the exemplary nozzle firing waveform 240-1 may be adjusted in a plurality of different ways. For example, the duration 241-2 is increased as shown at 240-2. Likewise, the duration can be decreased (not shown). The rise slope 243-3 and fall slope 244-3 of the nozzle firing waveform 240-3 is decreased and the duration 241-3 of the nozzle firing waveform 240-3 is increased. Alternately, the timing of the nozzle firing waveform can be adjusted as shown at 240-4. Still other variations will be apparent to skilled artisans.

Figure 21:
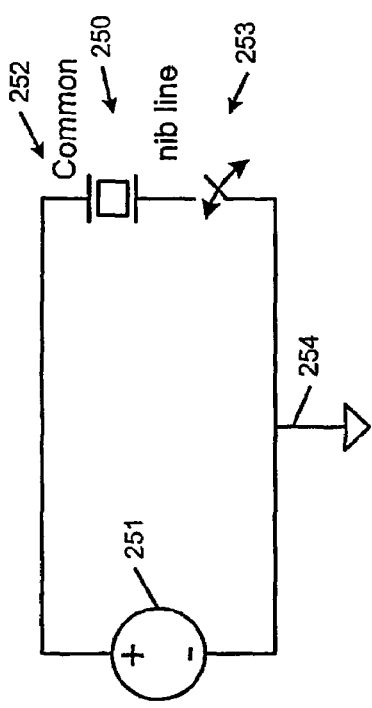
FIG. 21 is a functional block diagram of a nozzle drive circuit according to the prior art.

Referring now to FIG. 21, a conventional nozzle drive circuit 250 according to the prior art is illustrated and includes a fixed voltage source 251, a nozzle 252, and a switch 253. The switch 253 applies the fixed voltage across the nozzle 252 when the switch 253 is closed to fire the nozzle 252. Ground 254 is connected as shown. In the conventional nozzle driver circuit 250, the head 50 is configured for current flow into a common bar and out of a nib line when firing as shown by the arrow.

Figure 22:
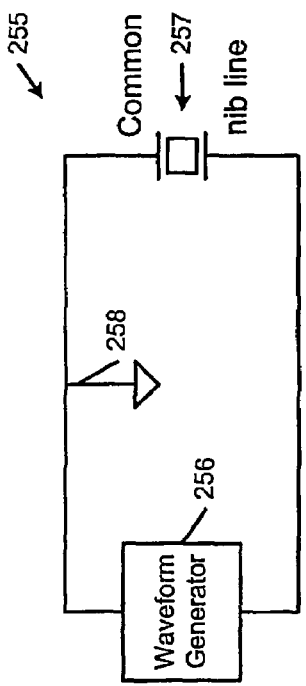
FIG. 22 is a functional block diagram of a nozzle drive circuit according to the present invention.

Referring now to FIG. 22, a nozzle drive circuit 255 according to the present invention is shown and includes a waveform generator 256 that is connected to a nozzle 257 and ground 258 as shown. The waveform generator 256 produces an adjustable voltage waveform. To maintain the same current polarity for firing, the nozzle drive circuit 255 holds the common line at ground and drives the nib line negative. The ground is at earth ground or at a floating positive voltage relative to the system power ground.

Referring now to FIG. 23, the waveform generating module and the waveform generators are shown in further detail. The controller 22 is connected via a bus 260 to a FIFO register 261. The FIFO register 261 is connected to a datapath sequencer 262 and shift registers 263. The datapath sequencer 262 is coupled to a configuration controller 264, which is coupled to a configuration latch 265, a pixel latch 266, and one or more digital to analog converter (DAC) sequencers 267-1, 267-2, . . . , and 267-$n$ (that are collectively referred to using reference number 267). The configuration latch 265 and the pixel latch 266 are coupled to shift registers 268. The pixel latch 266 is coupled to the DAC sequencers 267. The configuration latch 265 is connected to one or more configuration memory circuits 269-1, 269-2, . . . , and 269-$n$, which is random access memory (RAM) or any other suitable electronic storage.

Outputs of the DAC sequencers 267-1, 267-2, . . . , and 267-$n$ are coupled to weighted resistive ladder DAC circuits (RDAC) 270-1, 270-2, . . . , and 270-$n$ (which are collectively identified using reference number 270). Outputs of the RDAC 270-1, 270-2, . . . , and 270-$n$ are coupled to high-voltage operational amplifiers (OpAmp) 271-1, 271-2, . . . , and 271-$n$, which generate the output voltage that drives the nozzles 230. If the configuration memory 269 includes more than one configuration set, selectors 272-1, 272-2, . . . , 272-$n$ are used to select one of the configuration sets as will be described more fully below. While a selector 272 is shown for each configuration memory 269, a single selector for all of the configuration memories is used. The common selector switches all of the configuration sets individually or jointly.

In a preferred embodiment, the opamps 271 operate from +150V and −15V voltage supplies (not shown) and have a signal range from 0V to +135V, although other voltage ranges can be used. Head common is connected to either voltage supply rail or to a midpoint between the voltage supply rails. The voltage waveforms that are output by the opamps 271 are defined by one of more configuration sets including voltage and duration pairs. In a preferred embodiment, the voltage and duration pairs are defined by eight voltage and duration values designated v0,t0 to v7,t7 that are stored in the corresponding configuration memory 267.

Referring now to FIG. 24, the configuration memory 269 can include one or more configuration sets 276-1, 276-2, . . . , and 276-$n$. As will be described more fully below, a first configuration set 276-1 is selected for a first operating condition, a second configuration set 276-2 is selected for a second operating condition, and an nth configuration set 276-$n$ is selected for an nth operating condition. The selector 272 is used to select between the configuration sets 276. One possible use of multiple configuration sets will be described further in conjunction with FIGS. 28A-28D below. The configuration latch 265 is used to transfer configuration sets to the configuration memory 269. The pixel latch 266 is used to transfer pixel firing data to the DAC 267.

Figure 25:
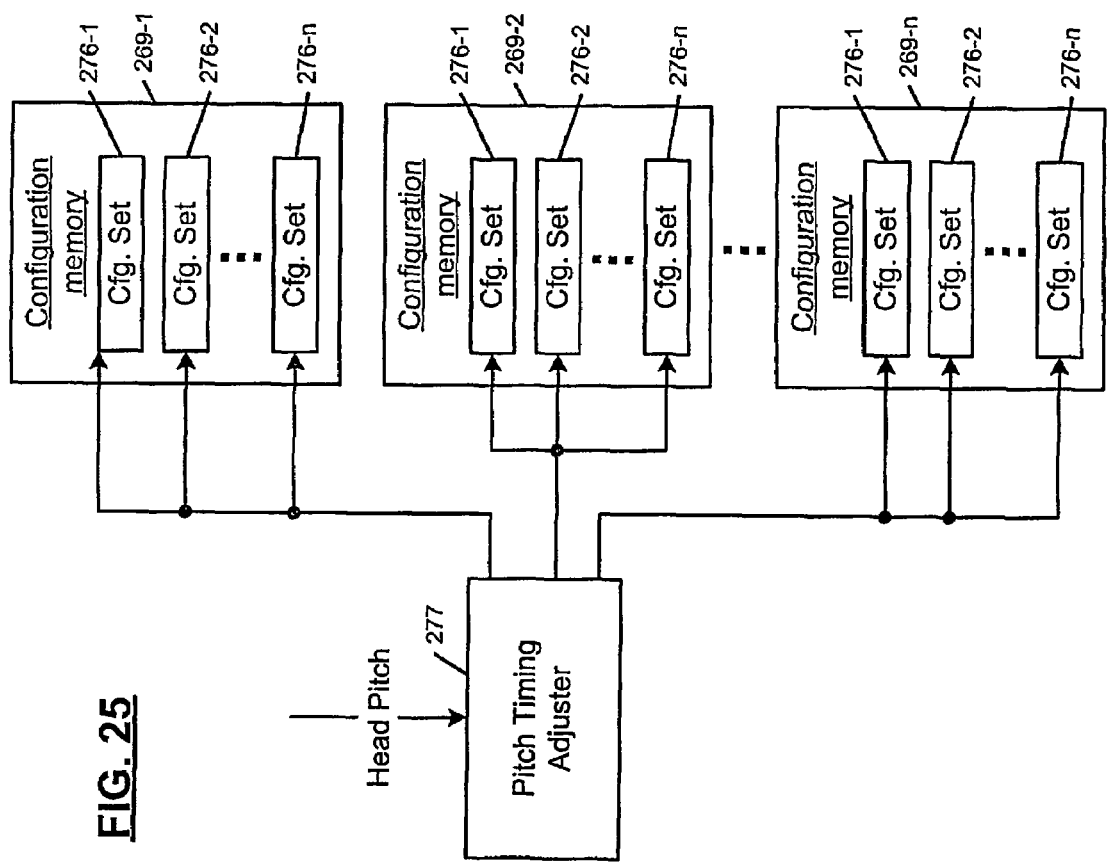
FIG. 25 illustrates waveform timing adjustment using a pitch timing adjuster that adjusts waveform timing of the configuration sets.

Referring now to FIG. 25, one method for adjusting for changes in the pitch of the head 50 is illustrated. A pitch timing adjuster 277 receives a head pitch signal from the controller 22. The pitch timing adjuster 277 uses the head pitch angle and the nozzle spacing to adjust the nozzle firing parameters for each nozzle. Timing offsets are generated and used to adjust the voltage and duration pairs.

Figure 26:
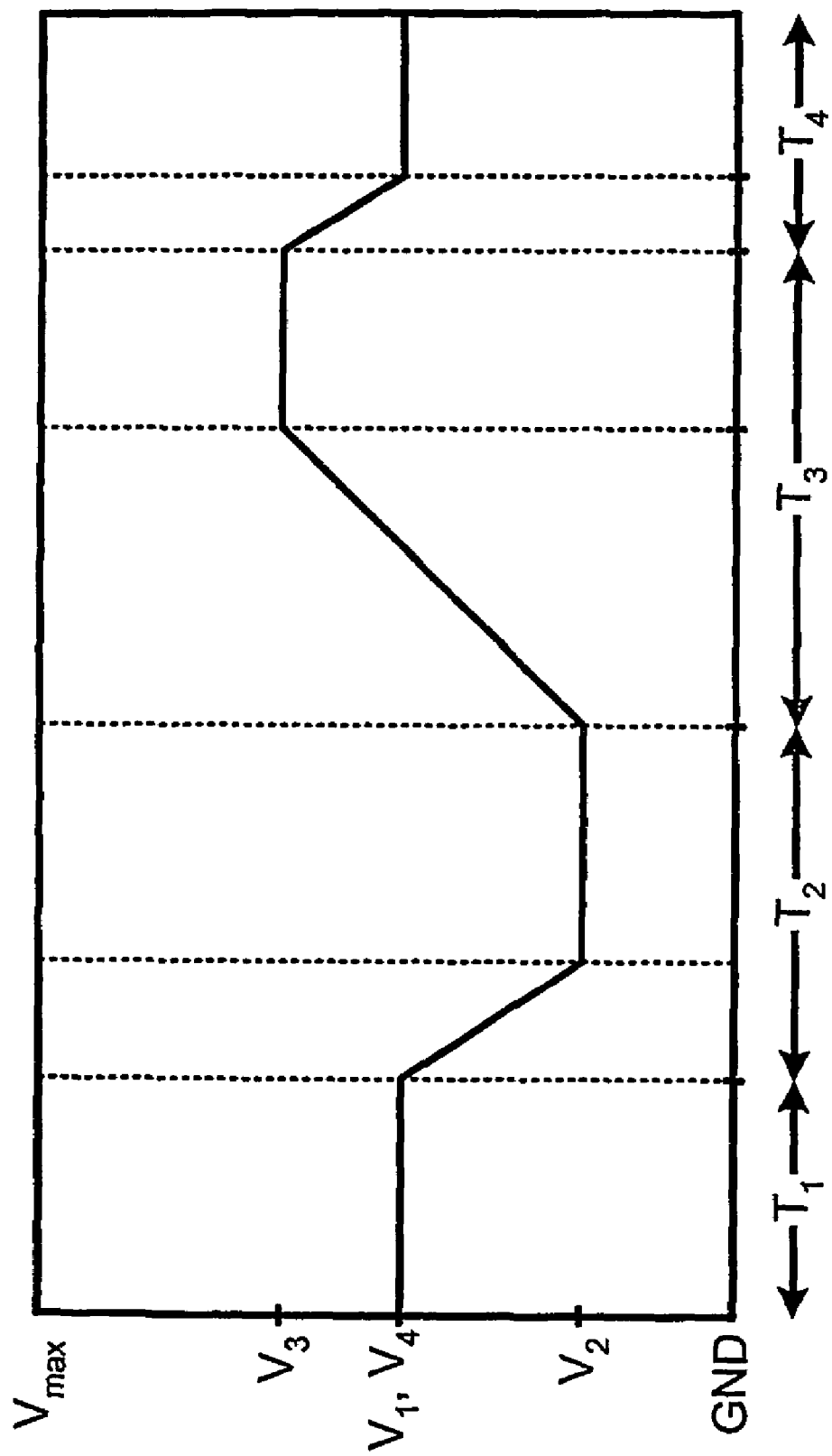
FIG. 26 illustrates a waveform associated with an exemplary configuration set.

Referring now to FIG. 26, a voltage waveform corresponding to an exemplary configuration set 276 is illustrated. The first voltage and duration pair v0, t0 in the exemplary configuration set 276 is used for storing up-slope and down-slope data. The last voltage and duration pair v7, t7 in the sequence preferably has t=0, which stops the waveform generation sequence. The output voltage preferably stays at a level that is set by a prior voltage and duration pair. For example, if t7=0 the output voltage remains at v6. When a new waveform segment such as v2,t2 is started, the voltage ramps from v1 to v2 at the down or up-slope as specified in v0,t0. The amount of time that is required to ramp the voltage is part of the specified duration t2. If the ramp takes less than the duration, the voltage waveform stays at the target voltage for a period that is equal to the duration minus the ramp time. If the ramp takes longer than the duration, the target voltage will not be achieved.

For example in FIG. 26, the voltage portion of the voltage and duration pair v1, t1 does not require a ramp because the voltage is equal to the voltage portion of the voltage and duration pair v4, t4. The voltage v2 is less than v1. Therefore, the voltage waveform ramps downwardly at the rate specified by v0, t0 until the voltage portion is equal to v2. Since t2>the ramp time, the voltage waveform remains at v2 for the remainder of t2.

The voltage v3 is greater than v2. Therefore, the voltage waveform ramps upwardly towards v3. Since t3> the ramp time, the voltage waveform remains at v3 for the remainder of t3. The voltage v4 is less than v3. Therefore, the voltage waveform ramps downwardly from v3 to v4. The remaining voltage and duration pairs (t5, t6, and t7) are set equal to 0 to identify the end of the sequence. Referring now to FIG. 27, an exemplary data structure for a configuration set 276 is illustrated.

Referring now to FIGS. 28A-28D, exemplary voltage waveforms that are generated by configuration sets 276 are illustrated. A first voltage waveform 280 is used if the nozzle has been fired recently, in other words within a predetermined period. The predetermined period is selected depending upon the properties of the fluid material and the nozzle. A typical value for the predetermined period is 5 milliseconds.

A firing threshold is illustrated at 281. The voltage waveform 280 exceeds the firing threshold 281 at 282 to eject the fluid material from the nozzle. Second or third voltage waveforms 283 or 284 is used when the nozzle has not fired within a predetermined period to provide an improved droplet profile. The voltage waveform 283 includes positive pulses 285 that do not exceed the firing threshold 281. The positive pulses 285 precede and/or follow a portion of the waveform that exceeds the firing threshold 281. Likewise, the voltage waveform 284 includes negative pulses 286 that do not exceed the firing threshold 281. The negative pulses 286 precede and/or follow a portion of the waveform that exceeds the firing threshold 281. A fourth voltage waveform 287 includes positive pulses 288-1 and/or negative pulses 288-2 that do not exceed the firing threshold 281. The pulses 288 are used to keep the fluid material dispensed by the nozzle in a liquid state and/or a state suitable for deposition. As can be appreciated, the portion of the voltage waveform that exceeds the firing threshold may be preceded by one or more positive and/or negative pulses of the same and/or different amplitudes.

The fourth voltage waveform 287 may be used when the nozzle has not been fired recently. The opamps 271 are transitioned from the voltage waveform 287 to the voltage waveforms 280, 282 or 284 when transitioning from non-firing to firing models. Likewise, the opamp transitions from the voltage waveforms 282 or 284 to the voltage waveform 280 when the nozzle is transitioning from reduced activity to increased activity.

The selector 272 is used to select between the configuration sets. For example, the selector 272 receives firing commands that are output by the sequencer 267. The selector 272 includes a timer that is reset when the firing commands are received. If the timer is less than a first predetermined period, the selector 272 selects a first configuration set 276-1. If the timer exceeds the first predetermined period, the selector 272 selects a different configuration set, e.g. 276-2. The selector 272 alternately receives sensor inputs from temperature sensors that sense a temperature of the fluid material and selects one of the configuration sets 276 based on the temperature. Still other methods for selecting the configuration set 276 will be apparent to skilled artisans.

Figure 29A:
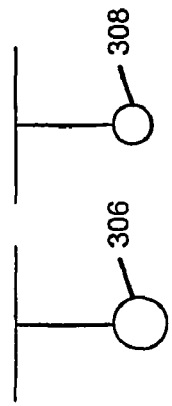
FIGS. 29A-29C illustrates drop formation analysis.
Figure 29B:
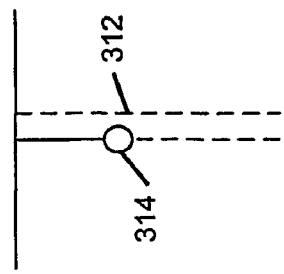
Figure 29C:

Referring now to FIGS. 5 and 29A-29C, the first and/or second cameras 52 and 84 are used to capture droplets 150 in flight. The drop analysis module 110 employs optical recognition to analyze the droplets 150 and to adjust the amplitude, timing, slope, shape, etc. of the firing voltage waveforms. The cameras are preferably digital cameras with strobes. For example in FIG. 29A, a first droplet 300 is shown without correction of the nozzle firing waveform. With correction of the nozzle firing waveform, a second droplet 304 from the same nozzle has the desired shape and size. In FIG. 29B, the first droplet 306 from a nozzle has a first voltage amplitude. A second droplet 308 from the same nozzle has a second voltage amplitude that is lower than the first voltage amplitude. As a result, the size of the second drop 308 is smaller than the size of the first drop 306. In FIG. 29C, the drop analysis module 110 generates a flag due to a clogged nozzle that is shown at 310.

Figure 30:
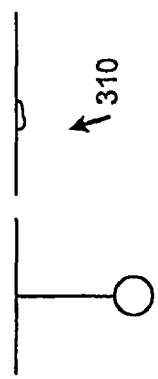
FIG. 30 illustrates drop alignment.

Referring now to FIG. 30, precise alignment of the microdeposition head 50 can also be performed using the drop analysis module 110 and the first and/or second camera 52 and 84. More particularly, an expected drop location identified at 312 is compared with an actual drop location identified at 314. Adjustments are made to align the expected drop location with the actual drop location. The drop alignment corrections are performed by the drop analysis module 110.

Droplet data is acquired by one or both of the cameras 52 and 84. The drop analysis module 110 calculates drop volume/mass, drop velocity, angle deviation, drop quality and formation, drop and nozzle consistency, and wetting of the nozzle plate 142. Adjustments to the nozzle firing waveforms are made based upon the collected drop data. For example, the nozzle firing waveform is delayed to control placement of the droplet. The pulse shape and width are adjusted to improve droplet quality and volume. Pulse voltage is used to adjust volume and/or quality in some situations. If other problems arise during drop analysis, head maintenance may be performed prior to further use of the microdeposition head 50. In addition, a user may be prompted before proceeding with additional microdeposition. Still other methods of modifying the nozzle firing waveform may be employed to impact the shape, timing, and/or volume of the droplets.

Referring now to FIGS. 31A and 31B, the microdeposition head 50 includes a plurality of nozzles 230 that are preferably spaced uniformly. However, non-uniform spacing can also be used. The angular orientation of the microdeposition head 50 is adjusted relative to a plane defined by lateral movement of the head assembly and/or the substrate. When the microdeposition head 50 has a generally perpendicular orientation relative to the movement of the substrate 53 (shown by arrow 336), the pitch is at a maximum value as is illustrated at 330. Likewise, an area that is swept by the head 50 is also at a maximum value as indicated at 332. As the angle of the head 50 is decreased from the perpendicular orientation, the pitch decreases as indicated at 340. Likewise, the area that is swept by the head 50 also decreases as indicated at 342.

Figure 32:
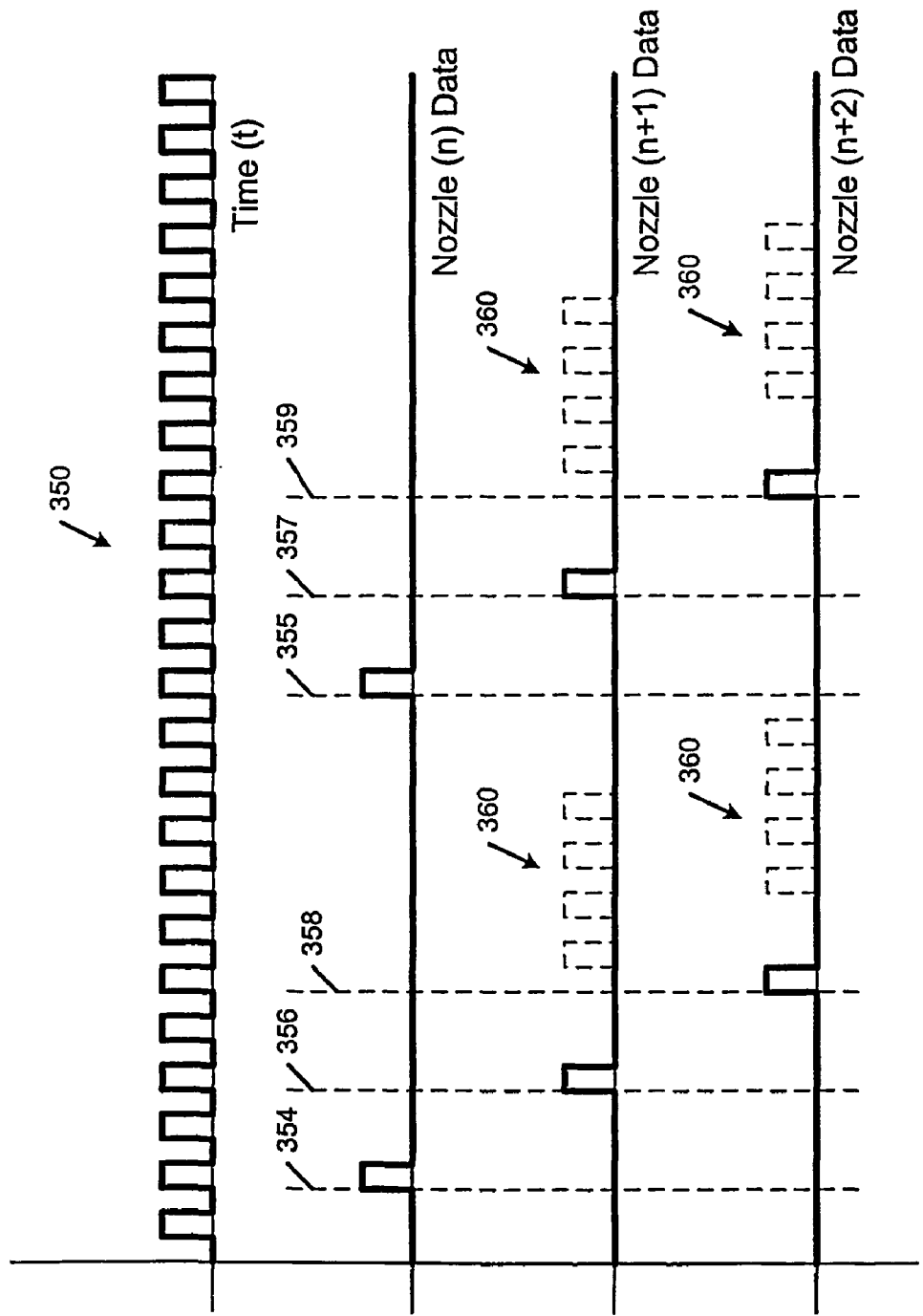
FIG. 32 illustrates an exemplary use of over-clocking to adjust for pitch changes of the microdeposition head.

Referring now to FIG. 32, over-clocking generally illustrated at 350 is used to provide improved resolution and to optionally adjust for changes in the pitch of the head 50. As used herein, over-clocking refers to an increased clock frequency relative to a droplet width and a lateral and vertical speed of the head. In microdeposition applications such as ink jets, a print grid is defined that includes grid lines that occur at a clock rate. The clock rate and lateral and vertical head speed are synchronized to provide (or not provide) one droplet in each rectangle (or square) of the grid. In other words, the droplet to grid rectangle ratio is 1:1. Some minor overlapping of droplets may occur in ink jets. Either a droplet is produced or is not produced in each rectangle or square of the grid.

Over-clocking according to the invention involves using a clock rate that is substantially higher. The clock rate is increased at least 3 times the conventional 1:1 ratio. In a highly preferred embodiment, the clock rate is increased 10×.

Referring now to FIGS. 31B and 32, to apply the fluid material in two adjacent straight lines that are perpendicular to the direction of movement of the head 50 (e.g. arrow 336), a first nozzle 350-1 is fired at first and second times 354 and 355. A second nozzle 350-2 is fired at third and fourth times 356 and 357, which are later than the first and second times 354 and 355, respectively. Likewise, a third nozzle 350-3 is fired at a fifth and sixth times 358 and 359, which are later than the second time 356. The dwell period between the time values for adjacent nozzles is determined by the pitch of the head 50. As the pitch decreases, the dwell period increases. Dotted lines at 360 show nozzle timing for smaller pitches.

Figure 33:
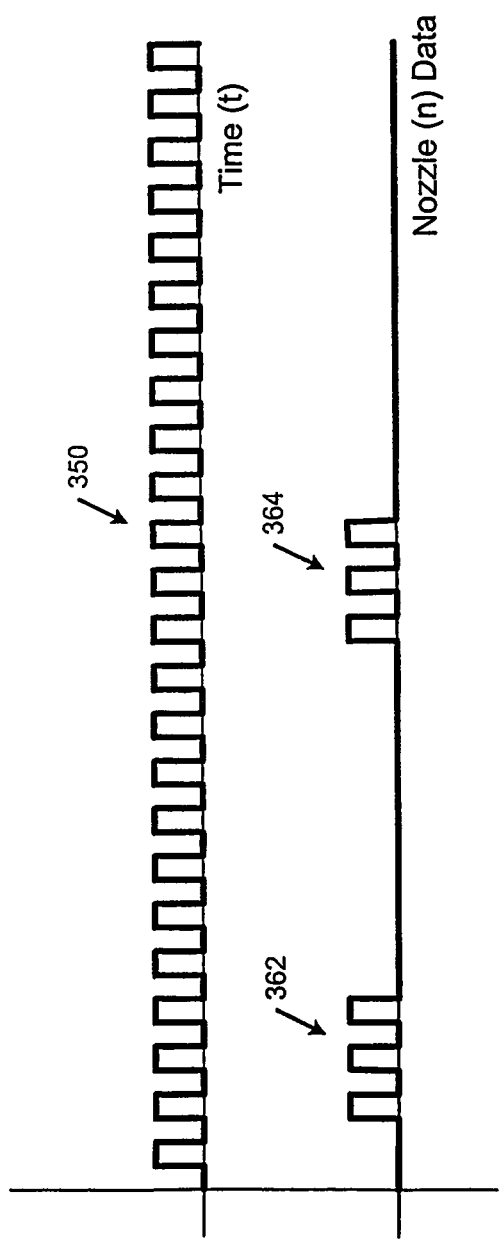
FIG. 33 illustrates an example of over-clocking to allow rapid nozzle firing and overlapping of the applied fluid material.
Figure 34:
FIG. 34 illustrates overlapping droplets.

Referring now to FIG. 33, over-clocking also allows fluid material to be fired rapidly from the nozzles. A single nozzle is fired repeatedly at 362 and 364 during adjacent clock cycles. For example, in FIG. 34 shows overlapping droplets 366-1, 366-2, and 366-3 and 368-1, 368-2, and 368-3 that are fired from a single nozzle. The amount of overlap and the spacing is determined by the over-clocking rate and the speed that the substrate 53 and/or head assembly 24 is moved.

Figures 35A, 35B:
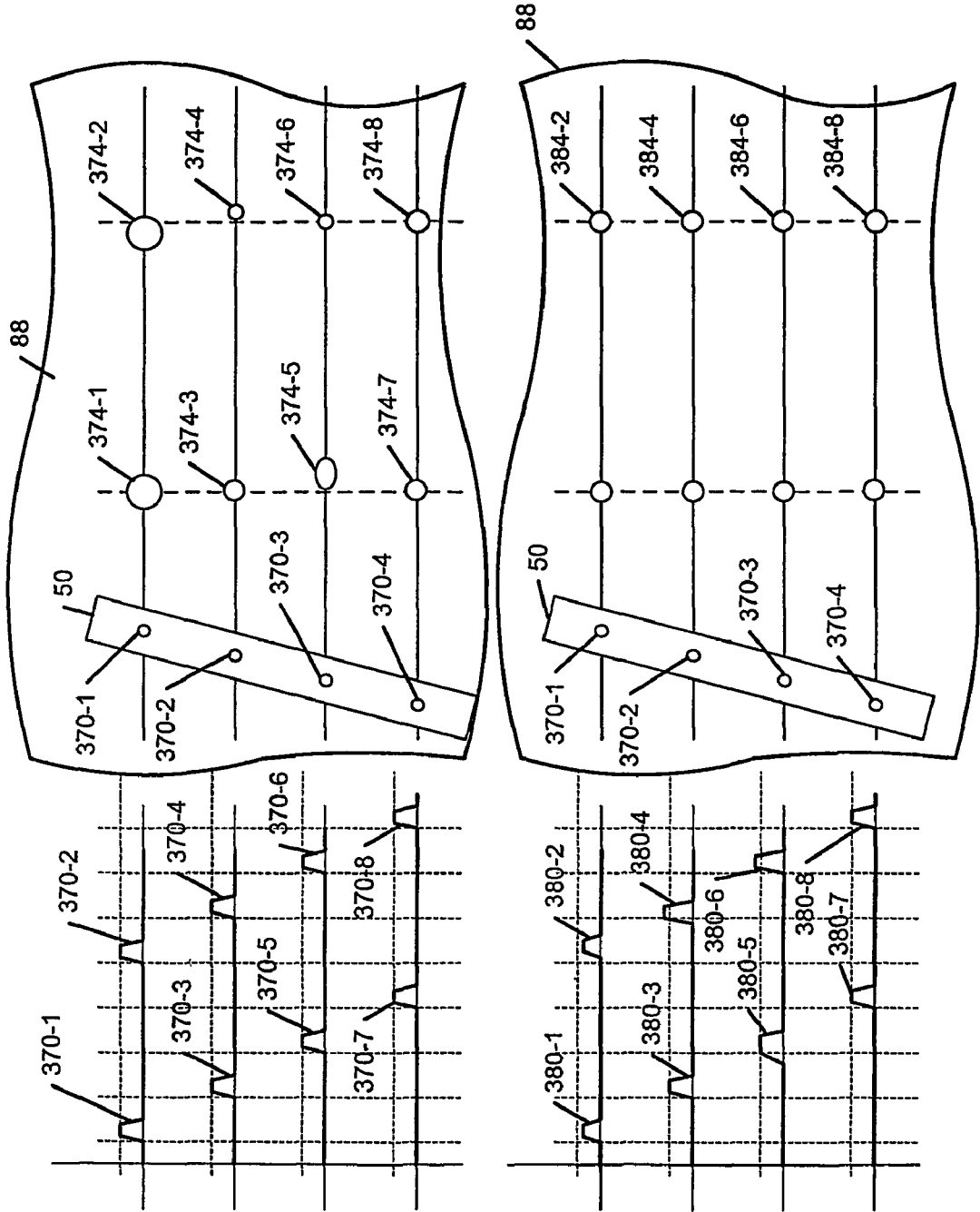
FIGS. 35A and 35B illustrate nozzle adjustments to provide uniform droplets.

Referring now to FIG. 35A, uncorrected nozzle waveforms 370-1, 370-2, 370-3, . . . and 370-8 that correspond to droplets 374-1, 374-2, 374-3, . . . , and 374-8 are shown. The droplet 374-1 is slightly larger than desired. Droplet 374-2 is slightly larger and earlier than desired. Droplets 374-3, 374-7 and 374-8 are okay. Droplet 374-4 is smaller and later than desired. Droplet 374-5 is later than desired and needs improved droplet quality.

In FIG. 35B, corrected nozzle waveforms 380-1, 380-2, 380-3, . . . and 380-8 that correspond to droplets 384-1, 384-2, 384-3, . . . , and 384-8 are shown. The nozzle firing waveform 381 has an adjusted amplitude. The nozzle firing waveform 382 has an adjusted amplitude and start time. The nozzle firing waveform 383 is left unchanged. The nozzle firing waveform 384 has an adjusted amplitude and start time. The nozzle firing waveform 385 has an adjusted rise slope and start time. The nozzle firing waveform 386 has adjusted amplitude. The nozzle firing waveform 384-7 and 384-8 are unchanged. As can be appreciated, the corrected nozzle waveforms 380 have uniform or desired shape and correct timing.

Figure 37:
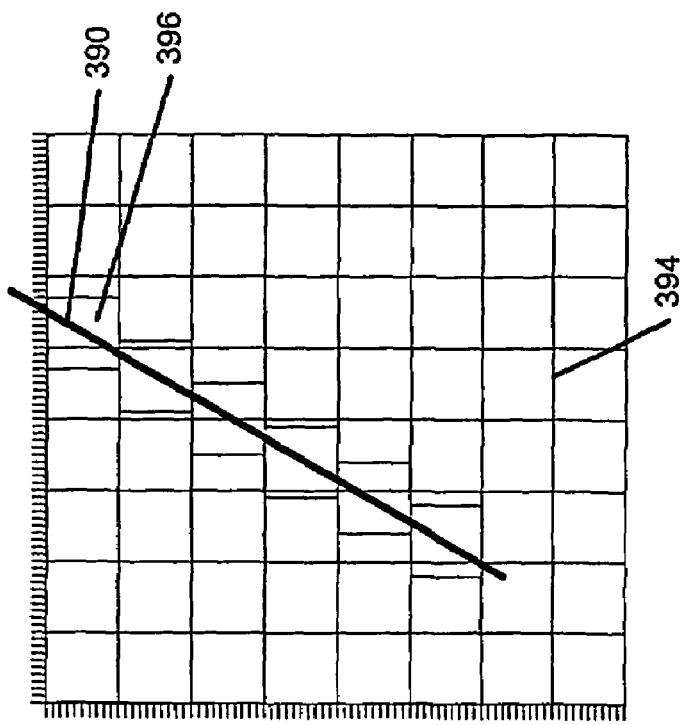
FIG. 37 illustrates a diagonal feature that is created with over-clocking.
Figure 36:
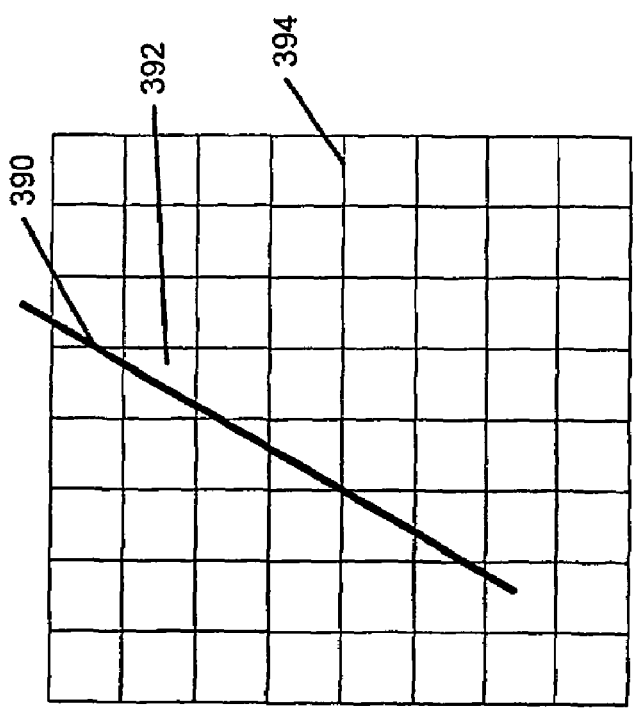
FIG. 36 illustrates a diagonal feature that is created without over-clocking.

Referring now to FIGS. 36 and 37, over-clocking also allows improved resolution when defining features using microdeposition. For example, when depositing a diagonal feature line 390 without over-clocking, a jagged feature line 392 results because the droplets in the jagged feature line 392 must be aligned with a grid 394. When over-clocking is used in FIG. 37, the droplets 396 is placed between the grid 394 and a more accurate feature line is produced.

Figure 39:
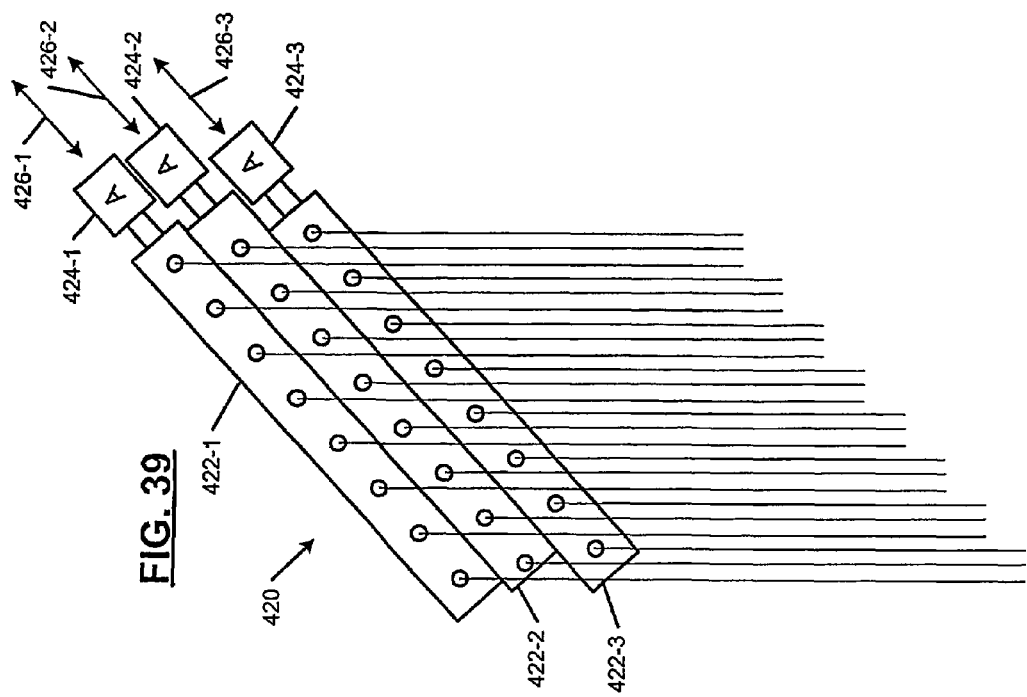
FIG. 39 illustrates multiple adjustable microdeposition heads that are attached together to provide adjustable pitch.
Figure 38:
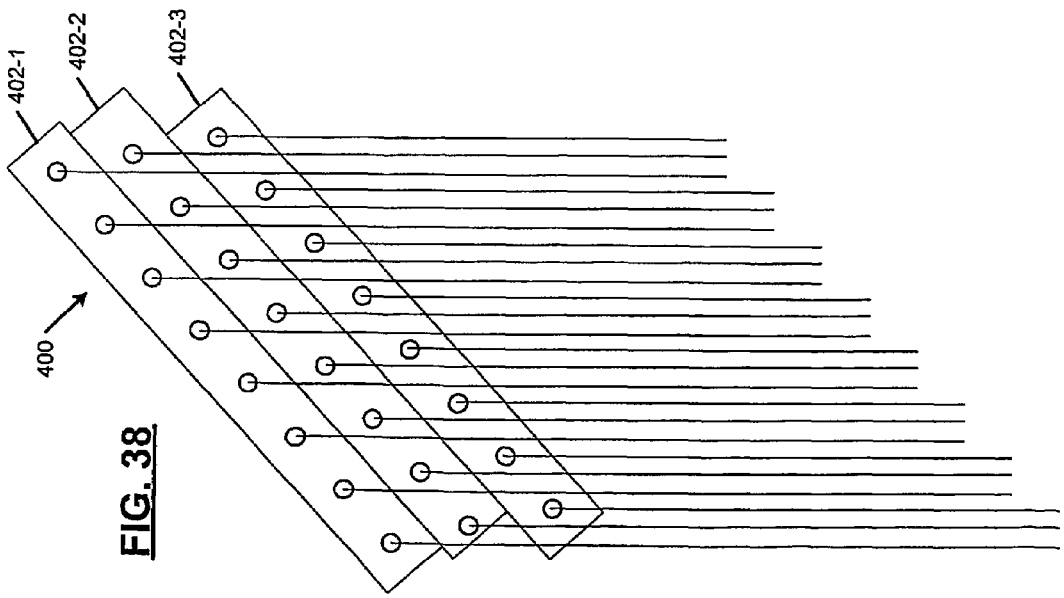
FIG. 38 illustrates multiple microdeposition heads that are attached together to provide reduced pitch.

Referring now to FIG. 38, a first modified microdeposition head 400 includes multiple microdeposition heads 402-1, 402-2, and 402-3 that are connected together or otherwise mounted in fixed relative positions. As can be appreciated, the modified microdeposition head 400 provides a reduced pitch as compared with a single microdeposition head 402. Referring now to FIG. 39, a second modified microdeposition head 420 is shown. The microdeposition head 420 includes multiple microdeposition heads 422-1, 422-2, and 422-3 that are moveable using actuators 424-1, 424-2, and 424-3 as indicated by arrows 426-1, 426-2, and 426-3. The angular position of the second modified microdeposition head 420 and the actuators 422 are adjusted by the controller 22 to provide a plurality of pitches.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A microdeposition system, comprising:
a head including a plurality of nozzles;
a controller that generates nozzle firing commands that selectively fire said plurality of nozzles to create a desired feature pattern;
configuration memories corresponding to each of said plurality of nozzles, which each stores voltage waveform parameters that define a plurality of voltage waveforms;
a selector that selects one of said plurality of voltage waveforms for each of said plurality of nozzles from said corresponding configuration memory;
digital to analog converter (DAC) sequencers corresponding to each of said plurality of nozzles, which each outputs said selected one of said voltage waveforms from said corresponding configuration memory;
DACs corresponding to each of said plurality of nozzles, which each outputs analog voltages based on said selected one of said voltage waveforms from said DAC sequencer; and
amplifiers corresponding to each of said plurality of nozzles, which each drives said corresponding nozzle based on said analog voltages from said corresponding DAC.

2. The microdeposition system of claim 1 wherein said DAC sequencers output said selected voltage waveforms after said nozzle firing command for said corresponding nozzle is received from said controller.

3. The microdeposition system of claim 2 further comprising a pixel latch that receives nozzle firing commands from said controller, wherein said pixel latch transmits said nozzle firing commands to said DAC sequencer.

4. The microdeposition system of claim 1 wherein said nozzles fire droplets when a voltage applied by said corresponding amplifier exceeds a firing threshold of said corresponding nozzle.

5. The microdeposition system of claim 4 wherein one of said voltage waveforms corresponding to each of said nozzles includes at least one of a positive conditioning pulse that does not exceed said firing threshold and a negative conditioning pulse that does not exceed said firing threshold.

6. The microdeposition system of claim 5 wherein said at least one of said positive conditioning pulse and said negative conditioning pulse precedes a firing pulse that exceeds said firing threshold.

7. The microdeposition system of claim 5 wherein said at least one of said positive conditioning pulse and said negative conditioning pulse follows a firing pulse that exceeds said firing threshold.

8. The microdeposition system of claim 4 wherein said selector selects said voltage waveforms based on a time since a droplet was last fired by said corresponding nozzle.

9. The microdeposition system of claim 8 wherein each of said configuration memories defines at least first and second voltage waveforms, and said selector selects said first voltage waveform when a time since a droplet was last fired by said corresponding nozzle is greater than a predetermined period.

10. The microdeposition system of claim 4 wherein each of said configuration memories defines at least first and second voltage waveforms, wherein said first voltage waveform exceeds said firing threshold, and said second voltage waveform remains below said firing threshold.

11. The microdeposition system of claim 10 wherein said selector selects said second voltage waveform to prevent fluid from being deposited on a substrate by said corresponding nozzle.

12. The microdeposition system of claim 1 further comprising a configuration latch that receives said voltage waveform parameters from said controller and that loads said voltage waveform parameters into said configuration memory.

13. The microdeposition system of claim 1 wherein said selector selects said voltage waveforms based on deposition fluid temperature.

14. A method for operating a microdeposition system, comprising:
providing a head including a plurality of nozzles;
generating nozzle firing commands that selectively fire said plurality of nozzles to create a desired feature pattern;
storing voltage waveform parameters that define a plurality of voltage waveforms for each of said plurality of nozzles;
selecting one of said plurality of voltage waveforms for each of said plurality of nozzles;
outputting said selected one of said voltage waveforms for each of said plurality of nozzles;
converting said outputted voltage waveforms into analog voltages for each of said plurality of nozzles; and
driving each of said plurality of nozzles based on said analog voltages.

15. The method of claim 14 further comprising outputting said selected voltage waveforms for each of said plurality of nozzles after said nozzle firing command is received for said corresponding nozzle.

16. The method of claim 14 further comprising firing a droplet from one of said plurality of nozzles by applying a voltage that exceeds a firing threshold.

17. The method of claim 16 further comprising storing a first voltage waveform for each of said plurality of nozzles that includes at least one of a positive conditioning pulse that does not exceed said firing threshold and a negative conditioning pulse that does not exceed said firing threshold.

18. The method of claim 17 wherein said at least one of said positive conditioning pulse and said negative conditioning pulse precedes a firing pulse that exceeds said firing threshold.

19. The method of claim 17 wherein said at least one of said positive conditioning pulse and said negative conditioning pulse follows a firing pulse that exceeds said firing threshold.

20. The method of claim 14 further comprising selecting one of said sets of voltage waveform parameters based on operating conditions of said nozzle.

* * * * *